United States Patent
Isaak

(10) Patent No.: US 6,180,881 B1
(45) Date of Patent: Jan. 30, 2001

(54) CHIP STACK AND METHOD OF MAKING SAME

(76) Inventor: Harlan Ruben Isaak, 2870 Chios Rd., Costa Mesa, CA (US) 92626

( * ) Notice: Under 35 U.S.C. 154(b), the term of this patent shall be extended for 0 days.

(21) Appl. No.: 09/073,254

(22) Filed: May 5, 1998

(51) Int. Cl.[7] .................................................. H01L 23/02
(52) U.S. Cl. ..................... 174/52.4; 257/686; 361/790; 361/761; 174/52.2
(58) Field of Search .................................... 257/686, 777, 257/779; 174/52.2, 52.4; 361/790, 761

(56) References Cited

U.S. PATENT DOCUMENTS

| | | | |
|---|---|---|---|
| 4,956,694 | 9/1990 | Eide | 257/686 |
| 5,266,912 | * 11/1993 | Kledzik | 333/247 |
| 5,313,096 | 5/1994 | Eide | 257/686 |
| 5,608,265 | * 3/1997 | Kitano et al. | 257/738 |
| 5,612,570 | 3/1997 | Eide | 257/686 |
| 5,748,452 | * 5/1998 | Londa | 361/790 |
| 5,798,564 | * 8/1998 | Eng et al. | 257/686 |

* cited by examiner

Primary Examiner—Kristine Kincaid
Assistant Examiner—Hung V Ngo

(74) *Attorney, Agent, or Firm*—Stetina Brunda Garred & Brucker

(57) ABSTRACT

A stackable chip carrier, made from plural layers of Kapton or other plastic material, and which may be made using conventional flex circuit techniques, has a central opening, a plurality of stacking apertures extending through the thickness thereof between opposite surfaces of the carrier and a conductive pattern therein which extends between the central opening and the stacking apertures. A chip is mounted within the central opening, and is electrically coupled to the conductive pattern such as by wire bonding or by soldering a ball grid array or other arrangement of contacts on the chip directly to the conductive pattern, and is encapsulated therein with potting compound using conventional chip-on-board encapsulation technology, to form a single layer integrated circuit element. Conductive elements such as metallic balls are inserted into the stacking apertures, and are mounted therein using solder or conductive epoxy, so as to electrically contact the conductive pattern and form a stackable IC chip package. A stack of the chip packages is assembled by arranging a stack of the packages so that the metallic balls which protrude from a surface of each package are inserted into the stacking apertures of an adjacent chip package, where they are electrically and mechanically secured by solder or conductive epoxy. Balls mounted within the stacking apertures of a lowermost one of the chip packages protrude from the bottom surface thereof, so that the completed chip stack forms a ball grid array product.

20 Claims, 18 Drawing Sheets

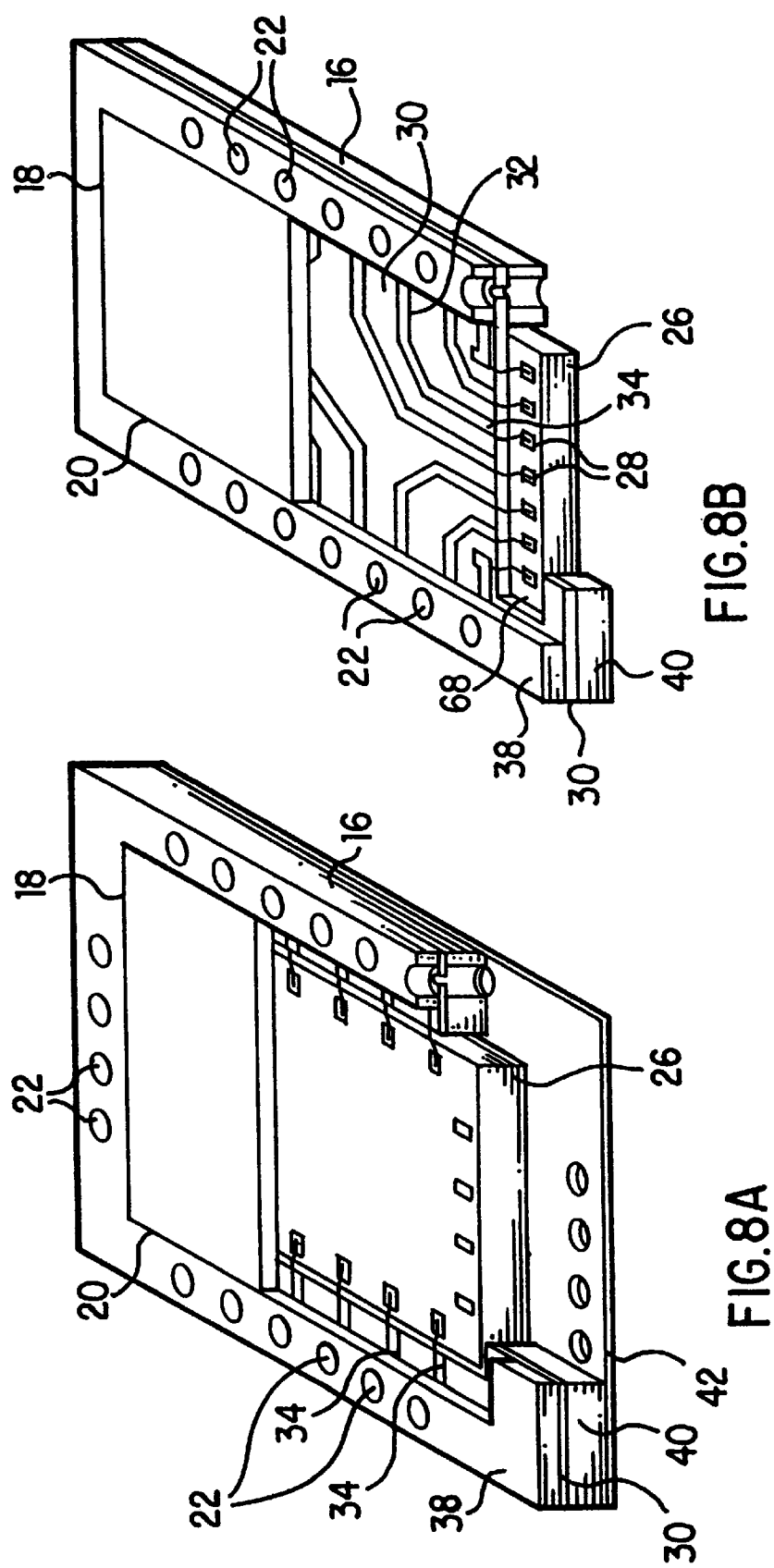

CHIP STACK AND METHOD OF MAKING SAME

BACKGROUND OF THE INVENTION

1. Field of the Invention

The present invention relates to chip stacks in which a plurality of integrated circuit chip packages arranged in a stack are electrically connected in a desired fashion and to methods of making such stacks.

2. History of the Prior Art

Various common approaches are used to increase memory capacity on a circuit board. Larger memory IC chips can be used, if available. The size of the circuit board can be increased in order to hold more IC chips. Vertical plug-in boards can be used to increase the height of the mother board. The memory devices can be stacked in pancake style (sometimes referred to as 3D packaging or Z-Stacking). The Z-Stacking approach interconnects from 2 to as many as 8 chips in a single component which can be mounted on the "footprint" of a single package device. This approach is the most volumetrically efficient. Package chips in TSOP (thin small outline package) or LCC (leadless chip carrier) form have been used for stacking, and are perhaps the easiest to use. Bare chips or dies have also been used, but the process for forming a stack thereof tends to be complex and not well adapted to automation.

In forming a stack of IC chips such as memory chips, the chips must be formed into a stack and at the same time must be electrically interconnected in desired fashion. Typically, the chips, which are mounted within packages therefor, have most of the electrical contacts thereof coupled in common or in parallel to contacts on a supporting substrate, and several unique contacts which are coupled individually to the substrate to the exclusion of the other chips. The prior art includes various different arrangements for electrically interconnecting the IC chips in a stack. For example, electrical conductors which may comprise thin film metal on an insulating base may be disposed perpendicular to the planes of the planar chips so as to connect those conductors on each chip which are exposed through openings in an insulating layer. Where the chip packages are assembled into a stack, electrical connections may be accomplished by lead frames or solder strips extending along the sides of the stack and attached to the electrical contacts of the chips.

Another common technique for providing the desired electrical interconnections in a chip stack is to form a stack of chips having bonding pads disposed on the chips adjacent the outer edges thereof. After assembling the stack of chips, the chip edges are ground flat and polished before sputtering an insulating layer thereon. The bonding pads on the edges of the chips are masked during the sputtering process to avoid covering them with the insulating layer. Next, a metal layer is sputtered onto the entire edge of the stack in conjunction with photomasking which forms conductor traces of the metal layer in desired locations for connecting the bonding pads.

Further examples of vertical stacks of IC chips and various methods of making such stacks are provided by U.S. Pat. Nos. 4,956,694, 5,313,096 and 5,612,570, which patents are commonly assigned with the present application. U.S. Pat. No. 5,612,570, which issued Mar. 18, 1997 and is entitled CHIP STACK AND METHOD OF MAKING SAME, describes a chip stack and a method for making the same in which chip packages are first assembled by mounting plastic packaged chips or thin, small outline package chips (TSOPs) within the central apertures of thin, planar frames having a thickness similar to the thickness of the packaged chip. Leads at opposite ends of the package are soldered to conductive pads on the upper surface of the surrounding frame. Each frame also has other conductive pads on the upper and lower surface thereof adjacent the outer edges of the frame, which are coupled to the conductive pads that receive the leads of the packaged chip by conductive traces and vias. A chip stack is then formed by stacking together a plurality of the chip packages and dipping the outer edges of the stack into molten solder to solder together the conductive pads adjacent the outer edges of the frames. The conductive pads adjacent the outer edges of the frame can be interconnected in a stair step arrangement, and pads on opposite sides of each frame can be coupled in offset fashion using vias, in order to achieve desired electrical interconnections of the various chips.

A still further example is provided by copending application Ser. No. 08/935,216, filed Sep. 22, 1997 and entitled CHIP STACK AND METHOD OF MAKING SAME. Such application, which is commonly assigned with the present application, describes formation of a stack of ball grid array chip packages by assembling a ribbon-like structure of thin, planar bases, each with plural terminals and an interconnecting conductive pattern thereon, and with the bases electrically interconnected by flex circuits extending therebetween. A different chip package is mounted on each base by soldering the balls of a ball grid array thereon to the terminals of the base. The bases alternate in orientation, so that alternate chip packages are joined to the tops and bottoms of the bases. The resulting arrangement is then folded over on itself, with chip packages being joined to adjacent bases using adhesive. The resulting chip stack is mounted on a substrate by soldering the balls of the ball grid array at the underside of the lowermost base at the bottom of the stack to the substrate. The conductive patterns on the bases and the interconnecting flex circuits form conductive pads which contact selected terminals of the various chip packages as the paths extend in alternating fashion through the chip stack between opposite sides of the stack.

A still further example is provided by copending application Ser. No. 08/971,499, filed Nov. 17, 1997 and entitled METHOD OF MAKING CHIP STACKS. Such application, which is commonly assigned with the present application, describes the making of a chip stack which begins with the formation of a plurality of panels having apertures therein and conductive pads on opposite sides thereof. Solder paste is deposited on the conductive pads prior to mounting plastic packaged IC chips within each of the apertures in each of the panels so that opposite leads thereof reside on the conductive pads as opposite sides of the apertures. The plural panels are then assembled into a stack, such as by use of a tooling jig which aligns the various panels and holds them together in compressed fashion. The assembled panel stack is heated so that the solder paste solders the leads of the packaged chips to the conductive pads and interfacing conductive pads of adjacent panels together, to form a panel stack comprised of a plurality of chip package stacks. Following cleaning of the panel stack to remove solder flux residue, the individual chip package stacks are separated from the panel stack by cutting and breaking the stack. Score lines across the topmost panel and transverse slots within remaining panels therebelow result in the formation of strips of chip package stacks when longitudinal cuts are made through the panel stack. The remaining portions of the uppermost panel within such strips are then snapped along the score lines thereof to separate the individual chip package stacks from the strips.

The various arrangements and methods described in the patents and patent applications noted above have been found to provide chip stacks and methods which are advantageous and which are suited for many applications. Nevertheless, the provision of further alternative arrangements and methods would be advantageous. In particular, it would be advantageous to provide chip stacks and methods of making such stacks which utilize available materials and known process techniques. The assembly of such stacks should lend itself to automated production methods, and thus would be competitive with other stacking approaches.

BRIEF SUMMARY OF THE INVENTION

The foregoing objects and features are achieved in accordance with the invention by a chip stack and methods of making the same which use available materials and known process techniques and in which automated production methods can be used. A thin stackable chip carrier is preferably made from plastic material such as Kapton, using conventional flex circuit techniques to assemble a plurality of different layers to form the chip carrier. A chip is mounted within a central opening in the carrier, and is electrically coupled to a conductive pattern within the carrier, before being encapsulated with a potting compound using conventional chip-on-board encapsulation technology. The chip carrier is formed with a plurality of stacking apertures or pockets which extend through the thickness thereof between opposite surfaces and which receive portions of the conductive pattern within the chip package. Electrical interconnections are accomplished by mounting spherical balls or other conductive elements within the apertures so as to electrically contact the portions of the conductive pattern within the apertures. The balls protrude from the surfaces of the chip carrier, thereby facilitating insertion of such balls within the apertures of adjacent chip carriers when forming a stack. The stack is thus formed using ball grid array technology, and the resulting stack has balls protruding from the bottom surface of the lowermost chip carrier, so that the stack forms a ball grid array component.

In preferred embodiments according to the invention, the stackable chip carrier includes a base layer with a conductive pattern on at least one surface thereof, a top layer mounted on the base layer and having a central aperture therein, and a center layer mounted on the base layer opposite the top layer and having a central opening therein. A plurality of stacking apertures or pockets extend through the entire thickness of the chip carrier defined by the base, top and center layers. The top and center layers, and a portion of the base layer other than the conductive pattern, are preferably made of Kapton or other plastic material using conventional flex circuit technology, enabling the stackable chip carrier to be made very thin without warpage or other undesirable effects. For certain applications, a bottom layer is mounted on the center layer opposite the base layer and has apertures therein aligned with the plurality of stacking apertures. The conductive pattern may be provided by layers of copper cladding on opposite sides of the base layer which are etched to form a desired conductive pattern.

With metallic balls mounted within the stacking apertures in the chip carrier, desired electrical interconnections of the balls with the conductive pattern are achieved by appropriately configuring the conductive pattern within the stacking apertures. Thus, the base layer can be provided with an aperture within the stacking aperture which is plated through between the layers of copper cladding. Alternatively, the base layer may be without an aperture therethrough in the stacking aperture, so as to have the layers of copper cladding on the opposite sides thereof. Also, the base layer may have an aperture therein adjacent the stacking aperture, which aperture is plated through between the layers of copper cladding. Still further, the base layer may have an aperture therein within the stacking aperture, but with one and not the other of the layers of copper cladding extending through the aperture in the base layer. In a still further connective arrangement, a portion of one of the layers of copper cladding is extended between an adjacent pair of the stacking apertures, and the base and center layers are provided with apertures therethrough adjacent the portion of one of the layers of copper cladding, so that a tool can be inserted through the apertures in the base and center layers to sever the portion of one of the layers of copper cladding if desired.

The stackable chip carrier is formed into a single layer integrated circuit element by installing a chip therein. The chip is mounted within the central opening in the carrier and is electrically connected to the conductive pattern within the carrier. In the case of a bare chip which has contacts on the outside thereof, such contacts are wire bonded to adjacent conductive pads forming a part of the conductive pattern. Where the chip has balls protruding from a surface thereof, such as in the case of a chip scale package (CSP) or a ball grid array (BGA), the balls are soldered to a portion of the conductive pattern, which serves to mount the chip within the central opening as well as electrically coupling the chip to the conductive pattern. Following installation and electrical interconnection of the chip, an appropriate encapsulant such as potting compound is introduced into the central opening so as to surround and encapsulate the chip.

In cases where the chip being installed in the chip carrier has contacts which are concentrated at the opposite ends thereof, the conductive pattern within the carrier may be designed so as to present conductive pads at opposite ends of the central opening in the chip carrier. After mounting the chip within the central opening, the conductive pads are wire bonded to the contacts at the opposite ends of the chip. The stacking apertures may be located at the opposite ends of the chip carrier adjacent the conductive pads. In a further arrangement in which the chip has contacts concentrated at the opposite ends thereof, the chip carrier may be formed with a layer adjacent the chip that has openings at opposite ends thereof adjacent the contacts at the opposite ends of the chip and a conductive pattern thereon having pads adjacent the openings in the opposite ends of the layer. The pads are wire bonded to the contacts at the opposite ends of the chip. The stacking apertures may be spaced along opposite sides of the chip carrier between the openings in the opposite ends of the layer and with the conductive pattern on the layer extending to the stacking apertures.

An IC chip stack is formed using a plurality of the single layer integrated circuit elements. Metallic balls or other conductive elements are mounted within the stacking apertures or pockets so as to protrude from the surfaces of the chip carriers. The balls may be mounted within the stacking apertures using conductive epoxy or solder, so that they make electrical contact with the conductive pattern of the chip carrier. Protrusion of the balls from the surfaces of the chip carrier facilitates insertion of the balls into the stacking apertures of adjacent chip carriers, where the balls are also secured and electrically interconnected using either conductive epoxy or solder. Mounting of the balls between the adjacent chip carriers in this fashion serves to mechanically secure the chip stack together. At the same time, the balls are electrically coupled to the conductive patterns within the chip carriers and form conductive columns extending through the stack. A desired conductive pattern arrangement can be achieved by configuring the conductive pattern within the stacking apertures in the manner previously described.

BRIEF DESCRIPTION OF THE DRAWINGS

A detailed description of the invention will be made with reference to the accompanying drawings. in which:

FIGS. 8A and 8B are broken-away perspective views of two different arrangements for mounting bare chips within the chip carriers to form the IC chip packages of the chip stack of FIG. 1;

DETAILED DESCRIPTION

Figure 1:
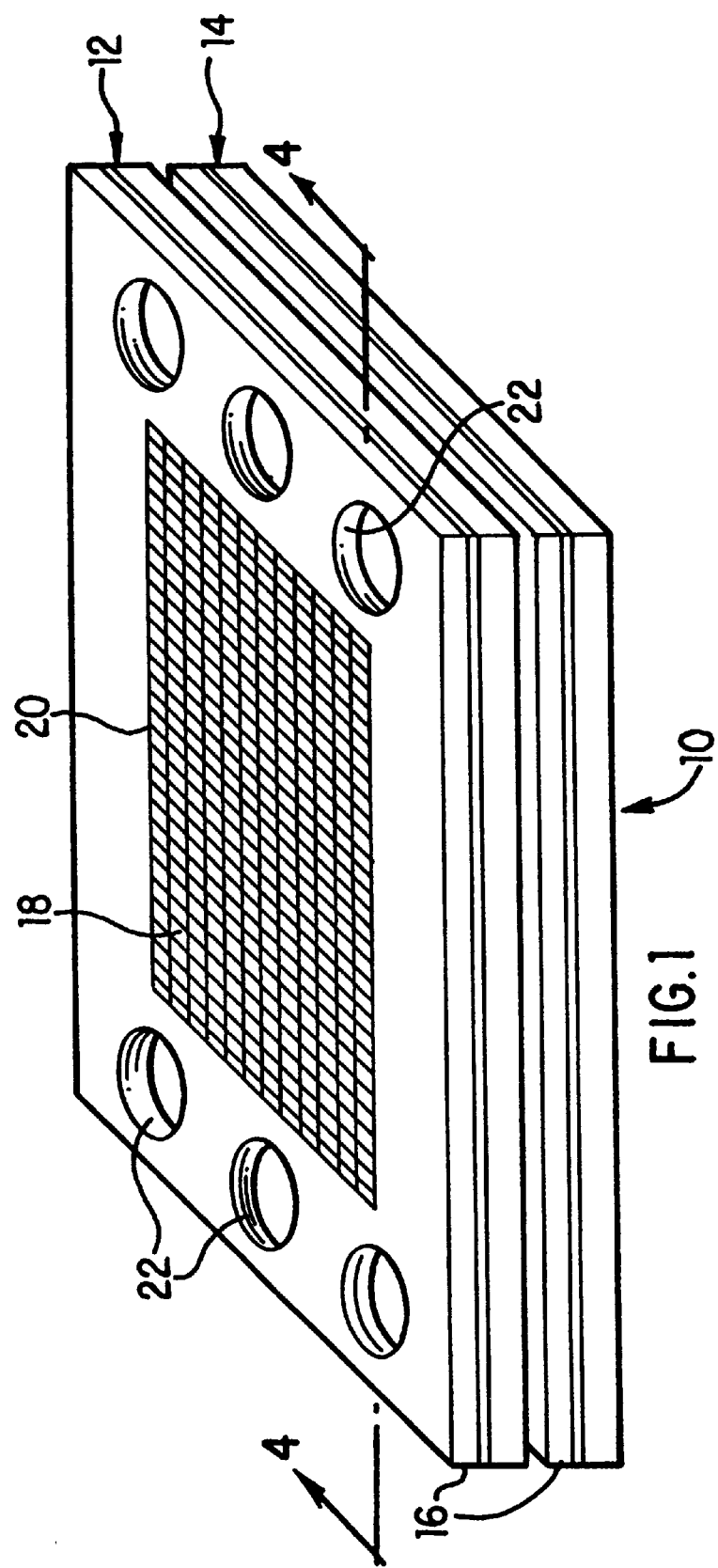
FIG. 1 is a perspective view of a chip stack in accordance with the invention.
Figure 2:
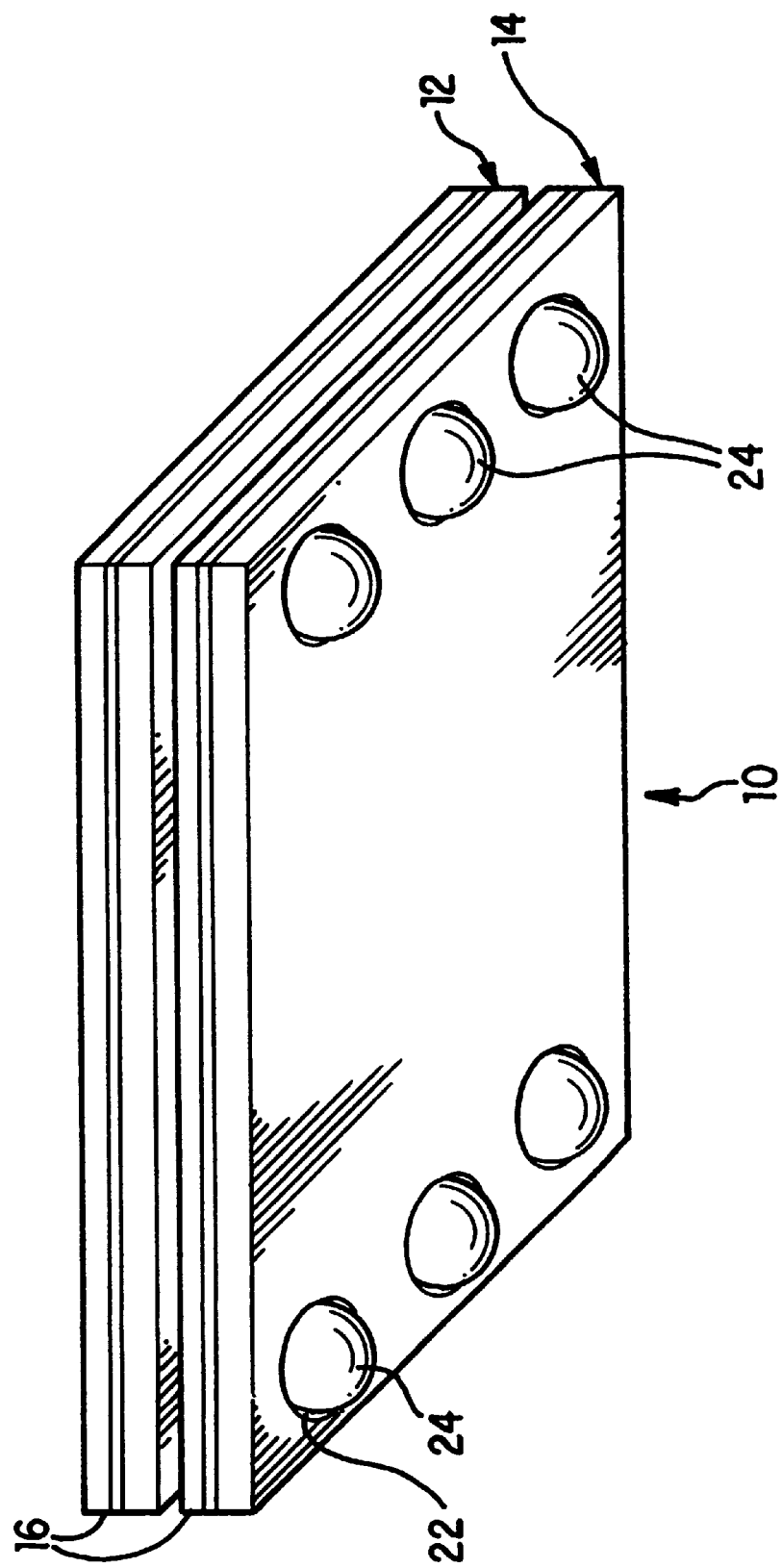
FIG. 2 is a perspective view of the chip stack of FIG. 1, taken from a different angle so as to illustrate the manner in which metal balls protrude from the bottom surface of a lower one of the chip packages within the stack.

FIGS. 1 and 2 show an IC chip stack 10 in accordance with the invention. The chip stack 10 is a two-high stack comprised of two different chip packages 12 and 14. However, it should be understood by those skilled in the art that the chip stack 10 can comprise almost any number of chip packages, with stacks of 4, 6 or even 8 packages being possible.

As described in detail hereafter, each of the chip packages 12 and 14 is principally comprised of a relatively thin, generally planar chip carrier 16, made of combinations of plastic such as Kapton and/or other suitable plastic materials. Each chip carrier 16 mounts an IC chip (not shown in FIGS. 1 and 2) therein, so that the chip is in electrical contact with a conductive pattern within the chip carrier 16. After mounting of the chip within the chip carrier 16, potting compound 18 is added to a central opening 20 in the chip carrier 16 to encapsulate the chip and seal it from the outside of the chip carrier 16. The conductive pattern within the chip carrier 16, to which the chip is electrically coupled, extends to each of a plurality of cylindrical apertures 22 which form interconnection pockets on opposite sides of the generally planar chip carrier 16 and in alignment with mating chip carriers to be stacked at the top and bottom thereof. Conductive elements, such as metallic spheres or balls 24, are mounted in the apertures 22 so as to contact the portions of the conductive pattern which extend to the apertures 22. The balls 24, which are mounted in the apertures 22 using conductive epoxy or solder, protrude from a surface of the chip carrier 16. The balls 24, which protrude from the surface of a chip package, are received within the apertures 22 of an adjacent chip package, in which they are mounted and extend into electrical contact with the conductive pattern of such chip package. The balls 24 provide desired electrical interconnections of the chip packages within the chip stack 10. They also facilitate alignment and mechanical interconnection of the adjacent chip packages and, when mounted within the apertures 22 of both chip packages of an adjacent pair, secure the chip packages together within the chip stack 10. The various balls 24 within the chip stack 10 form conductive columns within the chip stack 10. Within each chip package 12 and 14, the connections of the balls 24 to the conductive pattern can be varied to provide a desired pattern of interconnections between the balls 24 and the chips within the chip packages 12 and 14.

Figure 3:
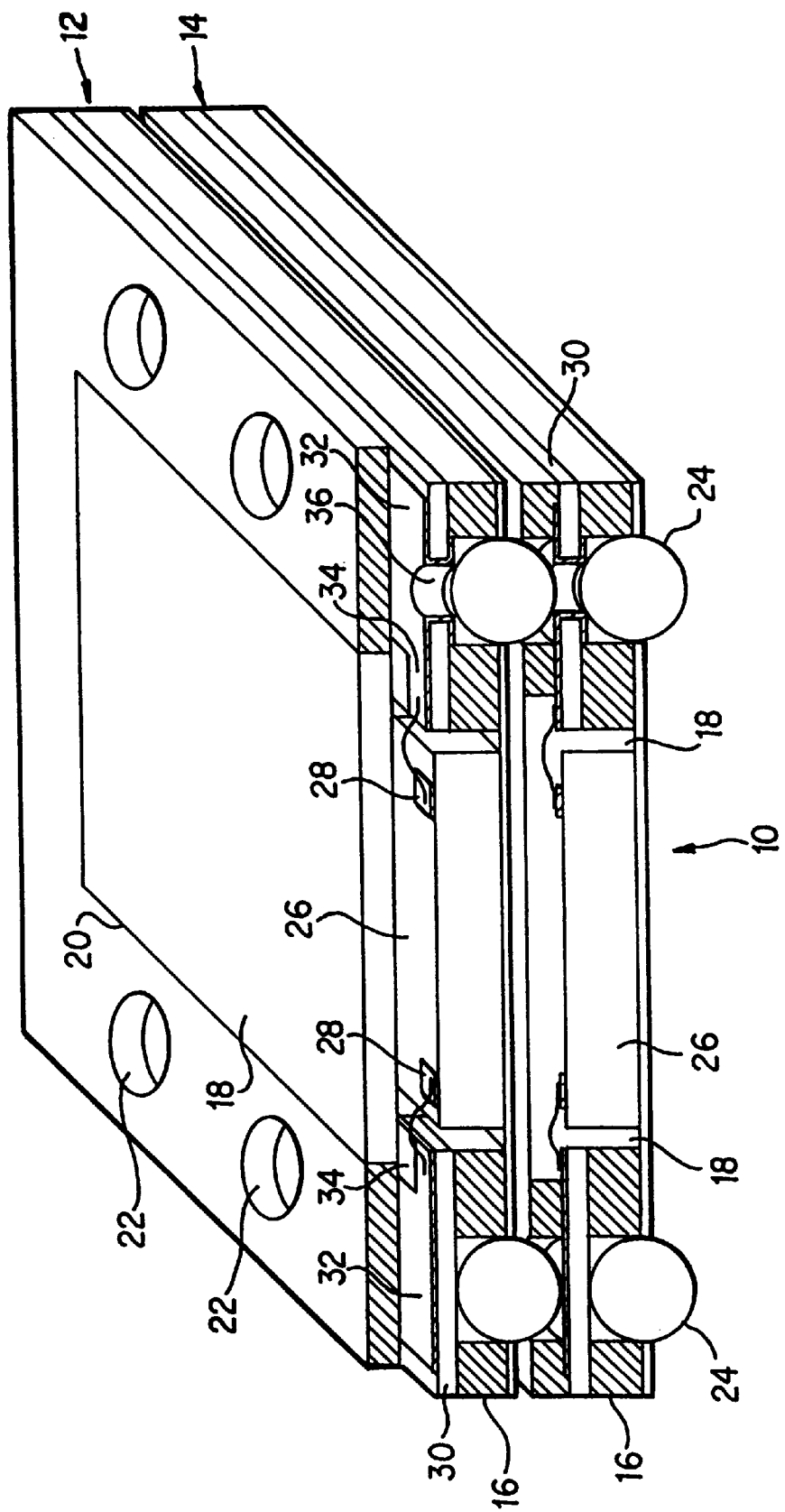
FIG. 3 is a cutaway view of the chip stack of FIG. 1.
Figure 4:
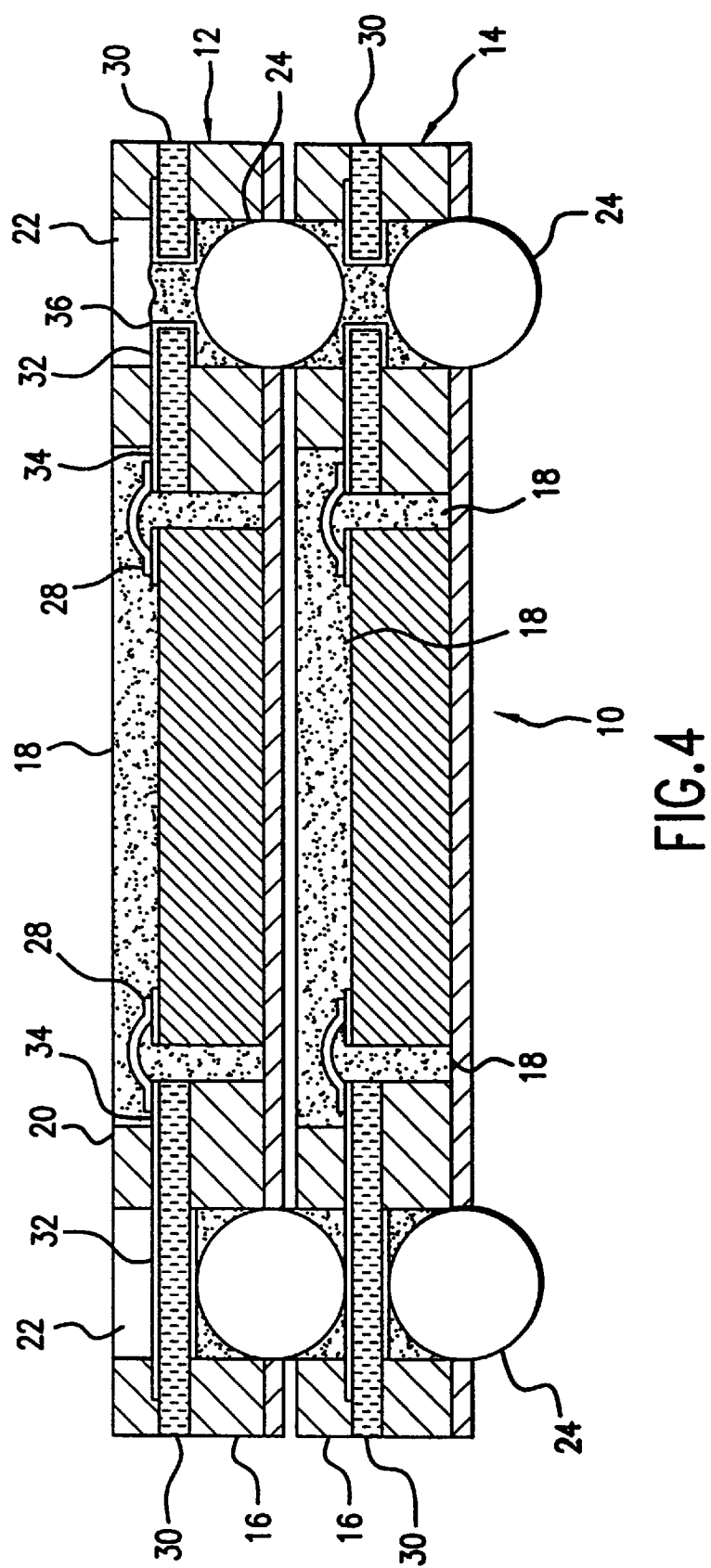
FIG. 4 is a cross-sectional view of the chip stack of FIG. 1 taken along the line 4—4 thereof.

FIGS. 3 and 4 show the internal details of the chip packages 12 and 14 of the chip stack 10. A different IC chip 26 is mounted within the central opening 20 of the chip carrier 16 of each of the chip packages 12 and 14, and is sealed therein by the potting compound 18. In the present example, each of the chips 26 is a bare chip which has a plurality of contacts 28 on an upper surface thereof. Each of the chip carriers 16 has a base layer 30 therein with a conductive pattern 32 thereon. As described in detail hereafter, the conductive pattern 32 may extend to opposite sides of the base layer 30, particularly within the apertures 22. The conductive pattern 32 includes a plurality of bonding pads 34 adjacent the chip 26. The bonding pads 34 are electrically coupled to the contacts 28 of the chip 26, such as by wire bonding. Wedge bonding using gold wire is preferred, and provides a low profile. In this manner, the chip 26 is electrically interconnected with the conductive pattern 32 of the chip carrier 16 thereof. The conductive pattern 32, in turn, is electrically interconnected in desired fashion with the balls 24 in the apertures 22.

As shown in FIGS. 3 and 4, a plurality of the balls 24 are present at the interface between the chip packages 12 and 14 so as to extend into the apertures 22 in both of the chip packages 12 and 14. The balls 24 are mounted within the apertures 22 using conductive epoxy or solder. This mechanically secures the balls 24 within the apertures 22, to couple together the chip packages 12 and 14 within the chip stack 10. It also ensures that the balls 24 make proper electrical contact with portions of the conductive pattern 32 within the apertures 22. FIGS. 3 and 4 depict two different examples of the manner in which the balls 24 can be electrically coupled to the conductive patterns 32 within the apertures 22.

As shown in the left hand portion of each of FIGS. 3 and 4, the base layer 30 of the chip carrier 16 of each chip package 12 and 14 extends through the apertures 22 and has no apertures therein. The conductive pattern 32 is present on both of the opposite surfaces of the base layer 30 within the apertures 22. Consequently, a ball 24 at the underside of a base layer 30 makes electrical contact with the conductive layer at the underside of the base layer 30. Conversely, a ball 24 at the top of the base layer 30 makes electrical contact with the layer of the conductive pattern 32 on the upper surface of the base layer 30. The various conductive layers of the conductive patterns 32 can be routed so as to provide desired interconnections between the balls 24 and the chips 26.

The right hand portions of FIGS. 3 and 4 depict a different example of the configuration of the conductive patterns 32 within the apertures 22. In this instance, each of the base layers 30 of the chip carrier 16 within the chip packages 12 and 14 has an aperture 36 therethrough within the aperture 22. Within the apertures 36 in the base layers 30, the conductive pattern 32 is plated through between the upper and lower conductive layers thereof. Such configuration provides a common electrical interconnection between the balls 26 at the upper and lower sides of a base layer 30 and the conductive pattern 32 thereof. These and other variations of the interconnect possibilities within the apertures 22 are described hereafter in connection with FIGS. 6A–6E.

Figure 5:
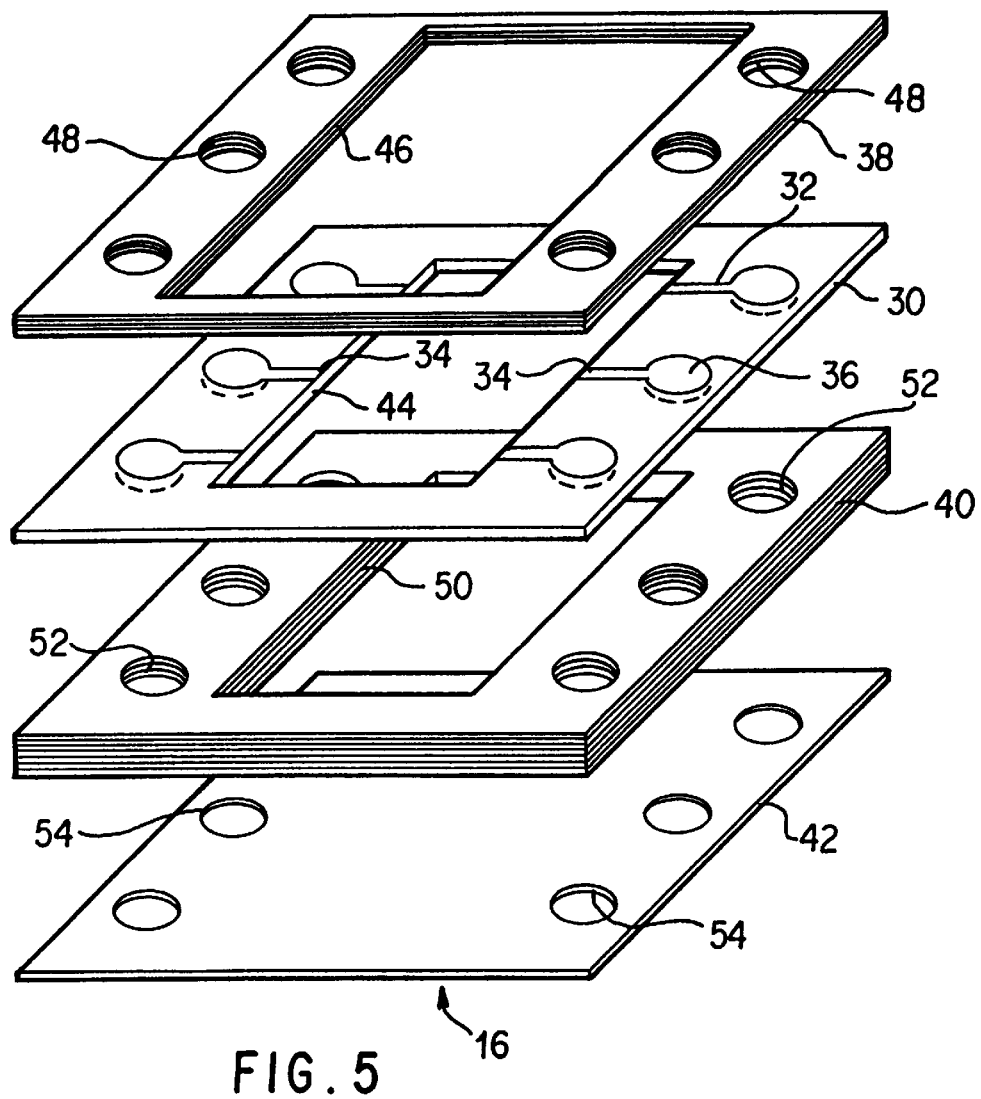
FIG. 5 is an exploded perspective view of the stackable chip carrier used in the chip packages of the stack of FIG. 1.

FIG. 5 is an exploded perspective view of the various layers which comprise the chip carrier 16. The chip carrier 16 includes the base layer 30, a top layer 38, a center layer 40 and a bottom layer 42. The base layer 30 includes the conductive pattern 32 with the bonding pads 34 adjacent a central opening 44 therein. In the present example, the base layer 30 is comprised of a 3 mil thick sheet of Kapton or other suitable plastic material, each of the opposite surfaces of which has a 1 mil thick layer of adhesive thereon which bonds a different 1 mil thick layer of copper cladding thereto. Etching is used to remove unwanted portions of the copper cladding, so that the desired conductive pattern 32 remains. The conductive pattern 32 shown in FIG. 5 corresponds to the conductive patterns 32 shown in FIGS. 3 and 4. Consequently, the bonding pads 34 on the left side of the base layer 30 form parts of conductive traces which extend to the apertures 22 on the left side of the chip carrier 16. At the apertures 22, the conductive trace on the top surface of the base layer 30 covers portions of the upper surface of the base layer 30 in the region of the apertures 22. Although not shown in FIG. 5, corresponding portions of the opposite lower surface of the base layer 30 are covered with a layer of the copper material. On the right side of the base layer 30, the bonding pads 34 form parts of conductive traces which extend to the apertures 36 in the base layer 30. The conductive copper layer extends around the circumference of the apertures 36 and is plated through to the undersides of the apertures 36.

The top layer 38 comprises a 5 mil thick sheet of Kapton or other suitable plastic material having a central opening 46 therein. The central opening 46 of the top layer 38 is larger than the central opening 44 of the base layer 30, so as to expose the bonding pads 34 of the conductive pattern 32 when the top layer 38 is mounted on the base layer 30. The top layer 38 has apertures 48 at opposite sides thereof which coincide with and form portions of the apertures 22 in the assembled chip carrier 16.

The center layer 40 comprises a 10 mil thick sheet of Kapton or other suitable plastic material having a central opening 50 therein which generally coincides with the central -opening 44 in the base layer 30. The center layer 40 also has apertures 52 which align with and form portions of the apertures 22 in the assembled chip carrier 16. The center layer 40 is mounted on the opposite side of the base layer 30 from the top layer 38. The bottom layer 42 is mounted on the opposite side of the center layer 40 from the base layer 30.

The bottom layer 42 is a 2 mil thick sheet of Kapton or other suitable plastic material having apertures 54 at opposite sides thereof. The apertures 54 align with and form portions of the apertures 22 in the assembled chip carrier 16. The central openings 44, 46 and 50 within the base layer 30, the top layer 38 and the center layer 40 respectively, combine to form the central opening 20 within the chip carrier 16.

It will be appreciated that the multi-layer structure of the chip carrier 16 readily lends itself to fabrication using presently known flex circuit technology. Such technology further enables the use of Kapton or other plastic material in the fabrication and assembly of the chip carrier 16. Unlike more conventional ceramic materials used in making chip carriers, which materials tend to warp when made in thin layers, the Kapton or other plastic material of the chip carrier 16 according to the invention can be used to form very thin layers within the chip carrier 16. Consequently, the assembled chip carrier 16 is relatively thin, and has a total width which is not much greater than the chip 26 that is mounted therein. This provides for the manufacture of chip packages of substantial thinness, and the assembly of a chip stack of considerable thinness, even where a relatively large number of chip packages are included in the stack.

FIGS. 6A–6E illustrate some of the different interconnections that can be used within the apertures 22. Two such interconnections are shown and described in connection with the left and right sides of the chip stack 10 illustrated in FIGS. 3 and 4.

Figure 6A:
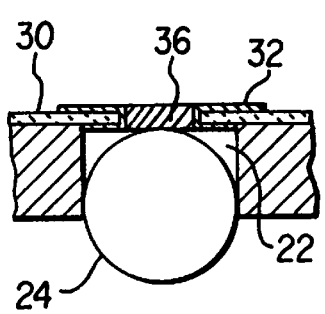
FIGS. 6A–6E are sectional views of a portion of one of the chip packages of the stack of FIG. 1 showing different electrical interconnection arrangements which are possible in the stacking apertures of the chip package.

A first type of interconnection shown in FIG. 6A corresponds to the interconnections shown at the right hand sides of the chip stack 10 of FIGS. 3 and 4. This is a straight through connection in which the upper and lower copper layers of the conductive pattern 32 are electrically coupled by plating through an aperture 36 in the base layer 30. This type of interconnection combines with the balls 24 to provide straight through conductive columns within the chip stack 10. Such interconnections are useful for connecting power, ground, address lines or similar common terminals of the various chips 26.

Figure 6B:
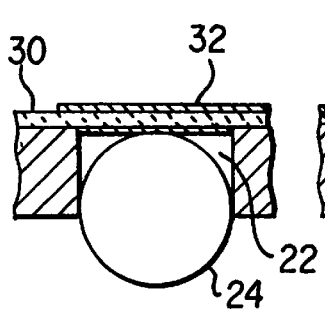

FIG. 6B shows another type of interconnection which is like the interconnections at the left hand sides of the chip stack 10 of FIGS. 3 and 4. In this case, the base layer 30 extends through the aperture 22 in the chip carrier 16 and has no aperture therein. The conductive pattern 32 over the aperture 22 and includes upper and lower layers of the copper cladding, with the lower layer contacting the ball 24 shown in FIG. 6B. This type of interconnection is used when a straight through connection is not required. It is particularly useful for "stair step" connections of the chip terminals, and in the case of the transposer board described hereafter in connection with FIG. 11.

Figure 6C:
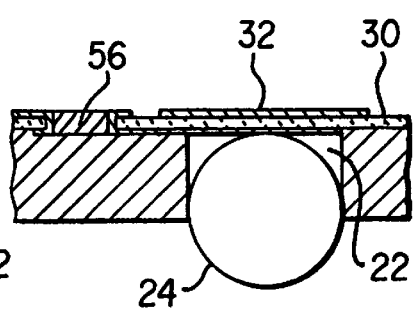

A third type of interconnection is shown in FIG. 6C. In this case, the base layer 30 extends through the aperture 22 and has no apertures therein within the aperture 22. Instead, the base layer 30 has an aperture 56 therein at a location adjacent but spaced apart from the aperture 22. At the aperture 56, the opposite copper layers of the conductive pattern 32 are plated through so as to electrically interconnect with each other. This type of interconnection is useful in connecting selected portions of the top and bottom copper layers of the conductive pattern 32.

Figure 6D:
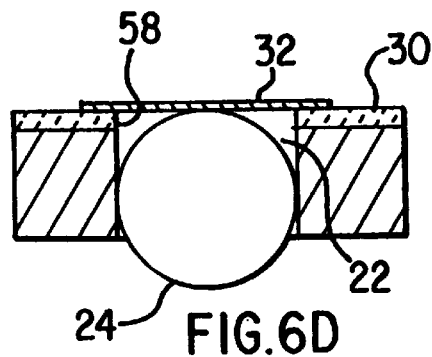

A fourth type of interconnection is shown in FIG. 6D. In this case, the base layer 30 has an aperture 58 therein which coincides with the aperture 22 in the chip carrier 16. The conductive pattern 32 consists of only the upper copper layer extending across the aperture 58 in the base layer 30. The ball 24 extends upwardly and into contact with the single upper copper layer of the conductive pattern 32. This type of interconnection provides an inexpensive approach, and is useful where "stair step" type crossover connections are not required.

Figure 6E:
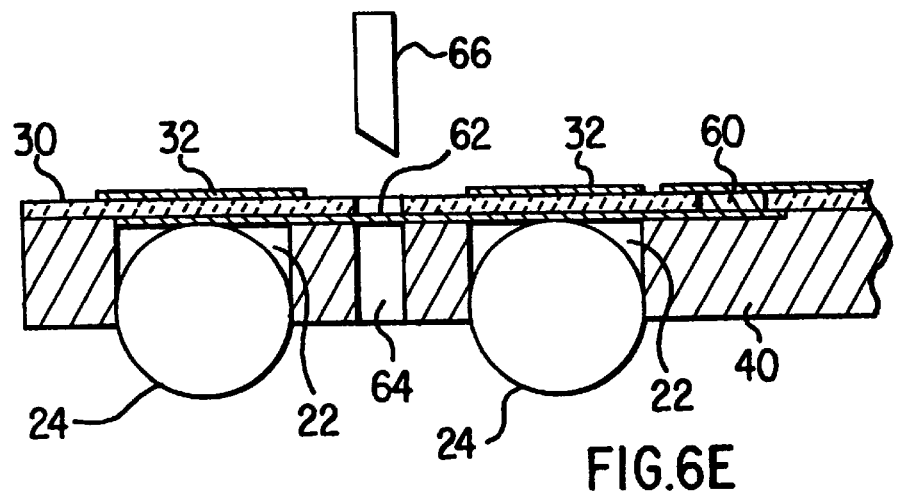

FIG. 6E illustrates a fifth type of interconnection which is useful for opening a circuit to program a chip package for a specific position within the chip stack 10. This type of approach eliminates "stair step" interconnections. In the arrangement of FIG. 6E, the base layer 30 extends through both of the apertures 22 illustrated. The only aperture in the base layer 30 is an aperture 60 which is located adjacent to but spaced from one of the apertures 22. The aperture 60 is plated through so as to interconnect upper and lower copper layers on the base layer 30. The lower copper layer extends through both apertures 22 where it contacts each of the balls 24 inserted into the apertures. Separate portions of the upper copper layer reside over the apertures 22. A portion 62 of the lower copper layer extends through an aperture 64 formed within the base layer 30 and the center layer 40 beneath the base layer 30. During configuration of the chip package in preparation for installation as part of the chip stack 10, it may be necessary to sever the portion 62 of the conductive pattern 32. This is accomplished by inserting a tool 66 into the aperture 64 and through the portion 62. The interconnection types illustrated in FIGS. 6A–6E are illustrated in conjunction with only the base layer 30 and the center layer 40 of the chip carrier 16, for simplicity of illustration. In actual practice, the top layer 38 is present over the base layer 30. Also, the bottom layer 42 is typically present at the bottom of the center layer 40, but is not used in all instances as described hereafter.

Figure 7A:
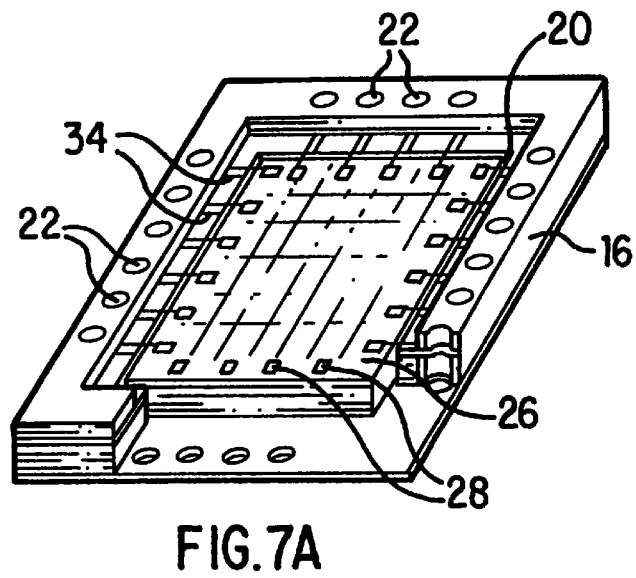
FIGS. 7A–7C are broken-away perspective views showing different arrangements of chips mounted within chip carriers in the chip packages of the stack of FIG. 1.
Figure 7B:
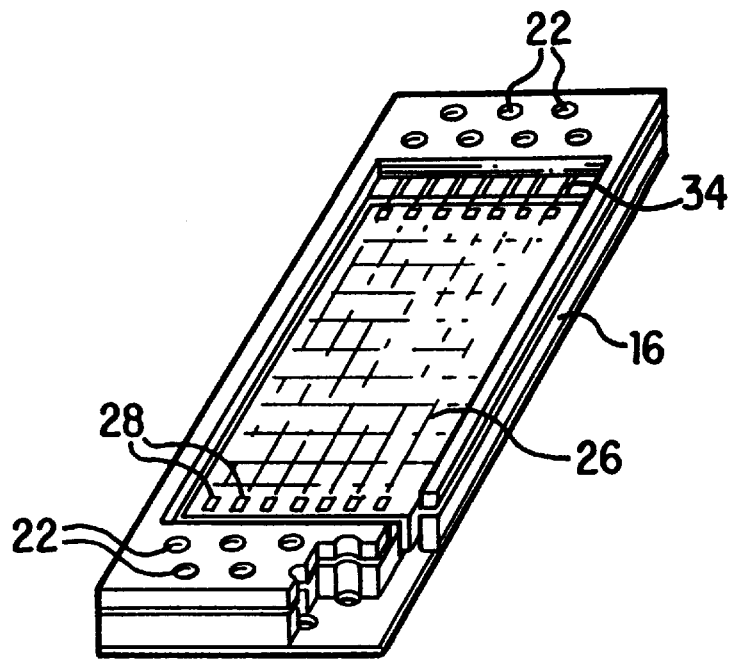
Figure 7C:
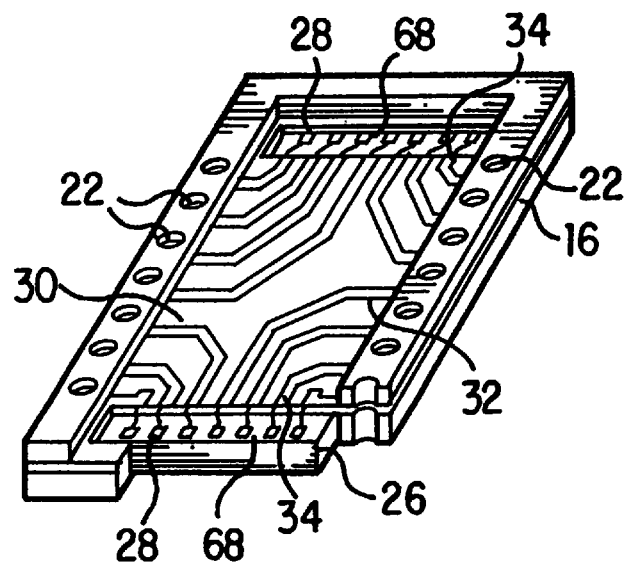

FIGS. 7A–7C show three different arrangements for packaging a bare chip or die. In this connection, the term bare chip or die is intended to mean a generally rectangular chip having an arrangement of contacts on the outer surface thereof. If the contacts are generally uniformly spaced around the outer periphery of the chip, so that a chip stack formed therefrom can accommodate 40 mil pitch ball grid spacing, then the arrangement shown in FIG. 7A is preferred. The chip 26 is mounted within the central opening 20 in the chip carrier 16 using adhesive. Wire bonds are made using a gold wire wedge bonder, to interconnect the relatively evenly spaced contacts 28 on the chip 26 with the bonding pads 34 spaced around the central opening 20 adjacent the chip 26. After wire bonding, the spaces remaining within the cavity formed by the central opening 20 are filled with an epoxy encapsulant and cured. The chip package as so formed can then be electrically tested.

In the arrangement of FIG. 7A, the apertures or stacking pockets 22 of the chip carrier 16 are spaced around the outer periphery thereof. As a result, the balls 26 protruding from the bottom surface thereof form a generally rectangular shaped ball grid array.

FIG. 7B shows an arrangement which may be used for an "end crowded" chip. The chip 26 therein is of elongated configuration and has the contacts 28 thereof at opposite ends thereof. The contacts 28 are wire bonded to the adjacent bonding pads 34 of the conductive pattern 32 at the opposite ends of the chip carrier 16. The opposite ends of the chip carrier 16 are provided with double rows of the apertures or stacking pockets 22 to provide for interconnection with the various bonding pads 32. The chip package as so formed has balls protruding from the lower surface thereof at the opposite ends of the chip package. This arrangement avoids the need to route the conductors around the corners of the chip to the sides thereof.

Like the arrangement of FIG. 7B, FIG. 7C shows an arrangement for use with an elongated chip 26 having the contacts 28 thereof at the opposite ends thereof. In the arrangement of FIG. 7C, the base layer 30 does not have the central opening 44 therein, but instead has elongated openings 68 at the opposite ends thereof so as to expose the contacts 28 at the opposite ends of the chip 26. The conductive pattern 32, which has a desired configuration, is disposed on the upper surface of the solid base layer 30, and the contacts 28 of the chip 26 are wire bonded to bonding pads 34 at the opposite ends of the base layer 30 adjacent the openings 68 therein. The conductive pattern 32 routes the bonding pads 34 to the apertures or stacking pockets 22 which are spaced along the opposite side edges of the chip carrier 16.

FIG. 8A illustrates the manner in which the chip package shown in FIG. 7A is completed. As previously noted, the chip 26 is mounted within the central opening 20 in the chip carrier 16 such as by use of an adhesive. The contacts 28 of the chip 26 are then interconnected with the bonding pads 34 of the conductive pattern 32 by wire bonding. The central opening 20 is then filled with potting compound to encapsulate the chip 26 and thereby complete the chip package. The completed chip package may then be electrically tested. The chip carrier 16 is comprised of the base layer 30, the top layer 38, the center layer 40 and the bottom layer 42. The bottom layer 42 provides a surface on which the chip 26 is mounted with adhesive when it is placed within the central opening 20.

FIG. 8B shows the manner in which the arrangement of FIG. 7C is completed. In the arrangement of FIG. 8B, the bottom layer 42 is omitted from the chip carrier 16 so that the chip 26 can be inserted through the central opening 50 in the center layer 40 for mounting at the underside of the base layer 30. The chip 26 is mounted on the underside of the base layer 30, such as by use of adhesive. The contacts 28 at the opposite ends of the chip 28 are then coupled through the apertures 68 in the base layer 30 to the bonding pads 34 of the conductive pattern 32, such as by wire bonding. The central opening 20 is then filled with potting compound. In this fashion, the chip package is completed, and may then be electrically tested. The bottom layer 42 of the chip carrier 16 is not necessary, but may be mounted on the underside of the chip 26 opposite the base layer 30, if desired.

Figure 9B:
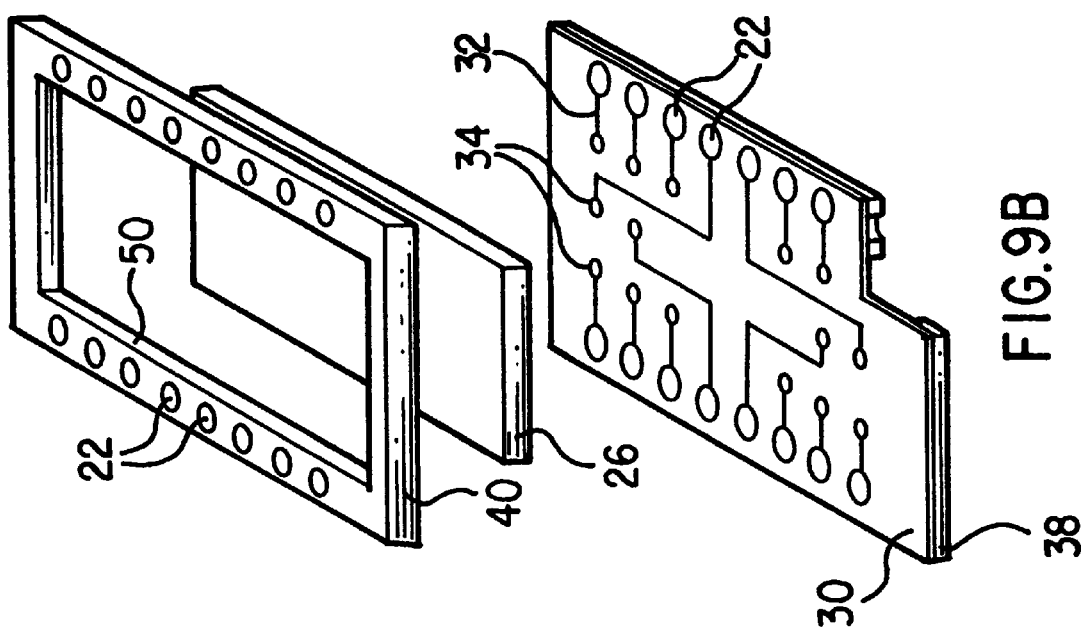
FIG. 9A is a broken-away perspective view and FIG. 9B is an exploded, partly broken- away, perspective view, showing two different arrangements for mounting chips having surface ball contacts in chip carriers to form chip packages in the chip stack of FIG. 1.
Figure 9A:
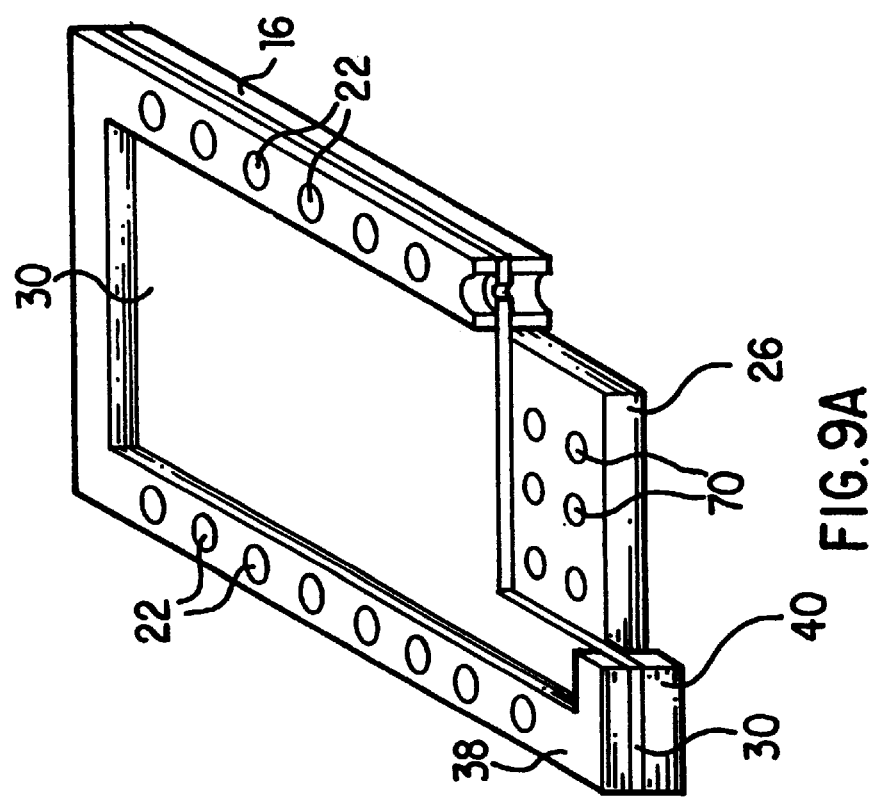

FIGS. 9A and 9B show arrangements used in the formation of chip packages which use either chip scale packages (CSPs) or ball grid array (BGA) chips. In the case of both CSP chips and BGA chips, as opposed to the bare chips previously described, a plurality of balls or bumps are provided at a surface of the chip to define the contacts of the chip. In the arrangements of FIGS. 9A and 9B, the chip carrier 16 is provided in two different pieces. A first such piece is formed by mounting the top layer 38 on the base layer 30. The base layer 30 is a continuous piece which does not have the central opening 44 therein in the manner of the previously described embodiments. The chip 26 is mounted on the underside of the base layer 30. As shown in FIG. 9A, an upper surface of the chip 26 has a plurality of bumps or balls 70 which protrude therefrom and form the contacts of the chip 26. The chip 26 may be of either the CSP or the BGA type. Both types of chips have the balls 70 on a surface thereof.

FIG. 9B is an exploded view of the arrangement of FIG. 9A, with the various portions thereof being inverted. As shown in FIG. 9B, the underside of the base layer 30 is provided with the conductive pattern 32 having bonding pads 34 located so that they are contacted by the balls 70 of the chip 26 when the chip 26 is mounted on the base layer 30. The conductive pattern 32 couples the bonding pads 34 to the apertures 22. The chip 26 is mounted on the underside of the base layer 30, such as by applying solder paste or conductive epoxy to the conductive pattern 32, placing the chip 26 in position thereon, and then reflowing the solder or curing the epoxy. The center layer 40, which forms a second part of the chip carrier 16, has adhesive applied thereto before being applied to the base layer 30. With the center layer 40 so mounted, the space defined thereby which surrounds the chip 26 is filled with potting compound to encapsulate the chip 26. The bottom layer 42 of the chip carrier 16, which is optional, can then be bonded to the underside of the chip package.

Figure 10A:
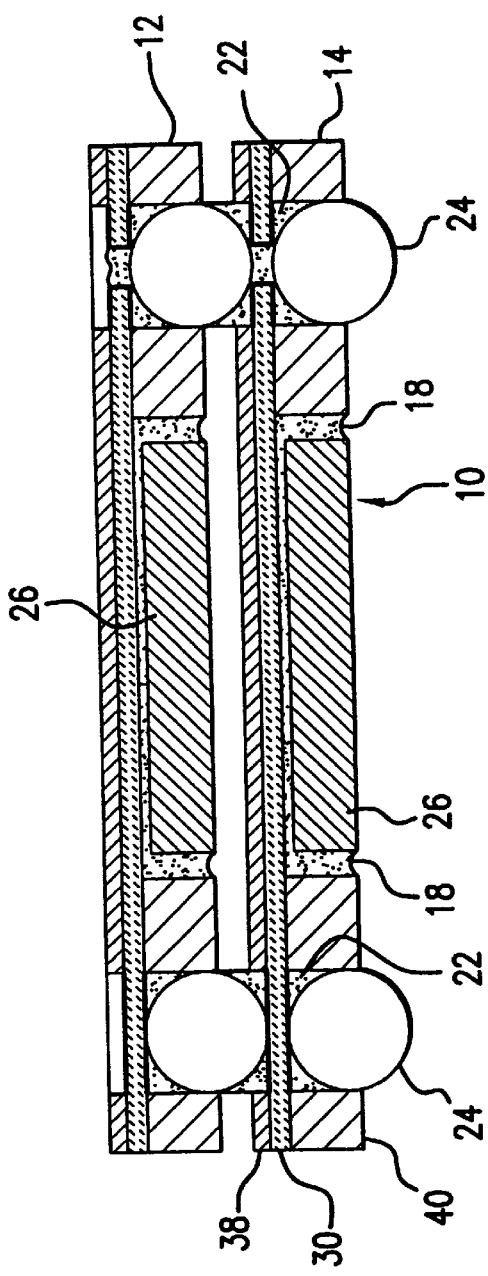
FIGS. 10A and 10B are cross-sectional views of the arrangements of FIG. 9A and 9B respectively.

FIG. 10A is a sectional view of a stack comprised of chip packages made in accordance with the arrangement of FIGS. 9A and 9B. In the case of each chip package, the chip 26 is mounted at the underside of the base layer 30, and is encapsulated with the potting compound 18. The chip 26 is of the CSP type, and is therefore relatively thin. As shown in FIG. 10A, the total thickness of each chip package is not substantially greater than the thickness of the CSP chip therein.

Figure 10B:
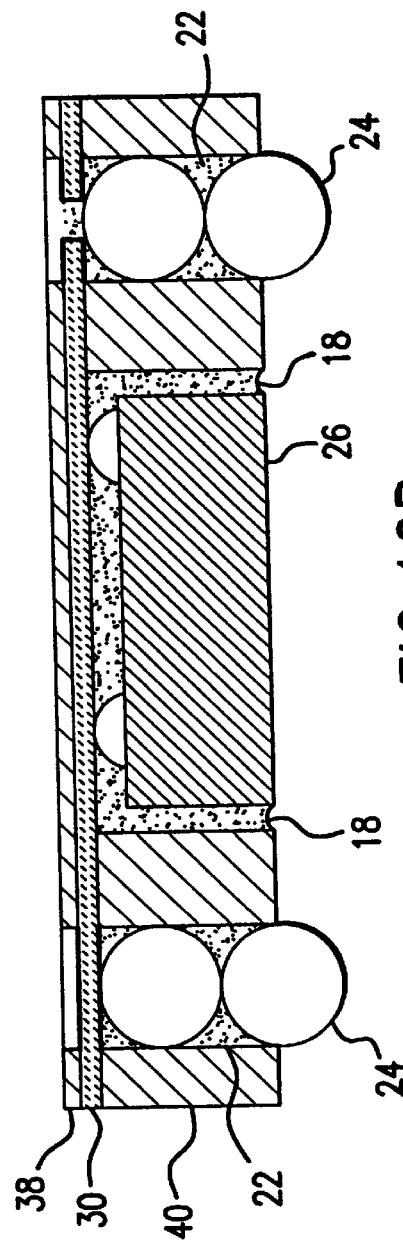

FIG. 10B is similar to FIG. 10A but depicts a single chip package in which a chip 26 of the BGA type is mounted. The BGA type chip of FIG. 10 is substantially thicker than the CSP chip shown in FIG. 10A. Again, however, the total thickness of the chip package is not substantially greater than the thickness of the BGA type chip 26. Because of the greater thickness of the chip package shown in FIG. 10B, each of the apertures 22 is provided with two of the balls 24. In this manner, the lower second ball 24 protrudes outwardly from the lower surface of the chip package.

Figure 11:
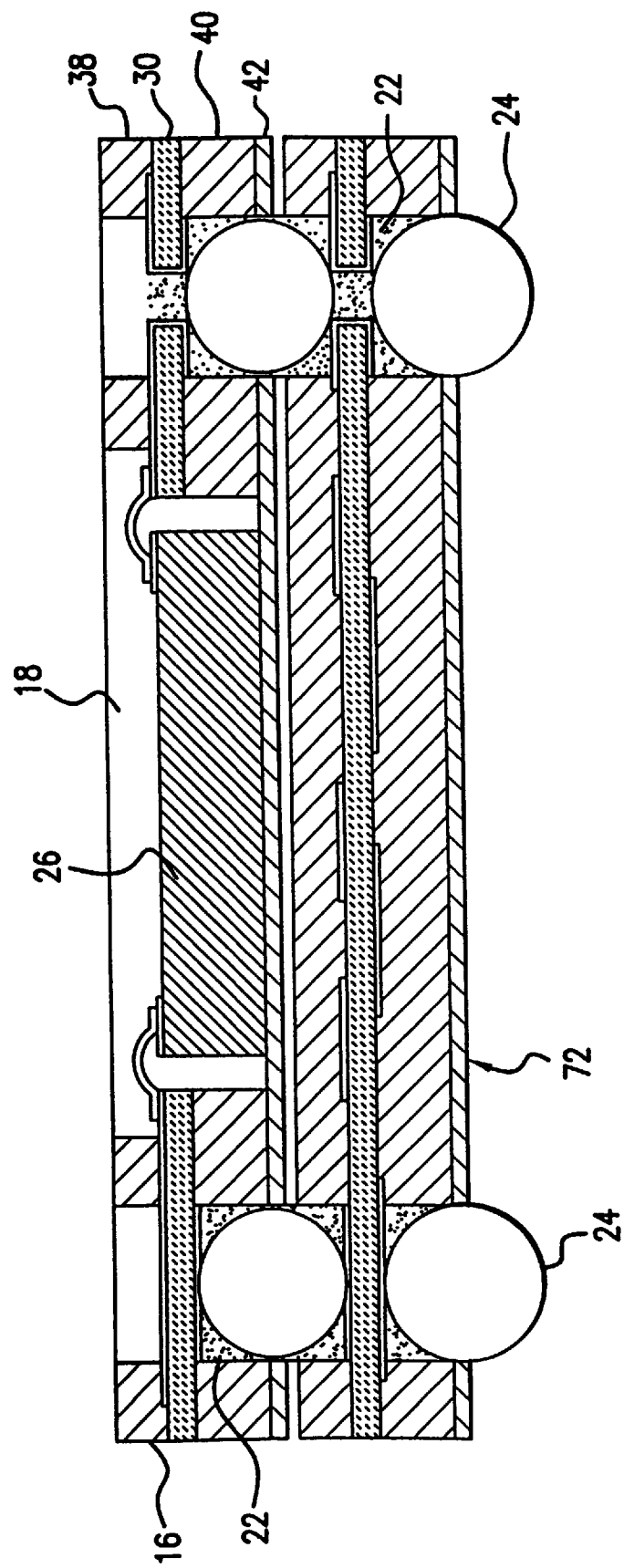
FIG. 11 is a sectional view of a two-high stack in which the lower package comprises a transposer board.

Occasionally, it may be necessary to reroute the connections of the balls 24 of a chip package externally rather than within the chip package. In such instances a transposer board 72 can be used. FIG. 11 shows a transposer board 72 mounted at the underside of a chip package. As shown therein, the transposer board 72 has a size and shape similar to that of the chip carrier 16 of the chip package. In fact, the transposer board 72 can be assembled from a top layer 38, a base layer 30, a center layer 40 and a bottom layer 42, in the manner of the chip carrier 16. However, none of the layers 38, 30, 40 and 42 are provided with central openings therein, resulting in a solid structure throughout the transposer board 72. The base layer 30 is provided with the desired conductive pattern 32. The conductive pattern 32 is routed to as to interconnect the various apertures 22 therein in desired fashion.

As previously described, the various chip packages such as the packages 12 and 14 of the chip stack 10 are mounted together when forming a stack thereof by disposing the balls 24 within the apertures 22 in the chip packages 12 and 14. The stacking pockets formed by the apertures 22 are advantageous in a number of respects. Because the balls 24 are temporarily placed within the apertures 22 and are then mechanically and electrically coupled therein, such as by using solder or conductive epoxy, the apertures 22 define confined spaces for the solder or epoxy. This prevents the solder or epoxy from getting on other portions of the chip packages. It tends to hold the balls 24 in place while the solder is reflowed or the epoxy is heated. When the balls 24 are placed in the stacking pockets defined by the apertures 22, they are held captive in the pockets, and they are self-aligning as a stack of the chip packages is formed.

The balls 24 can be standard, commercially available metallic balls. Available balls range in size from 10 mils diameter to 35 mils diameter. 20 mil diameter balls have been used in some of the embodiments described herein. Such balls are typically made of 90% lead and 10% tin, and may be copper plated.

Figure 12A:
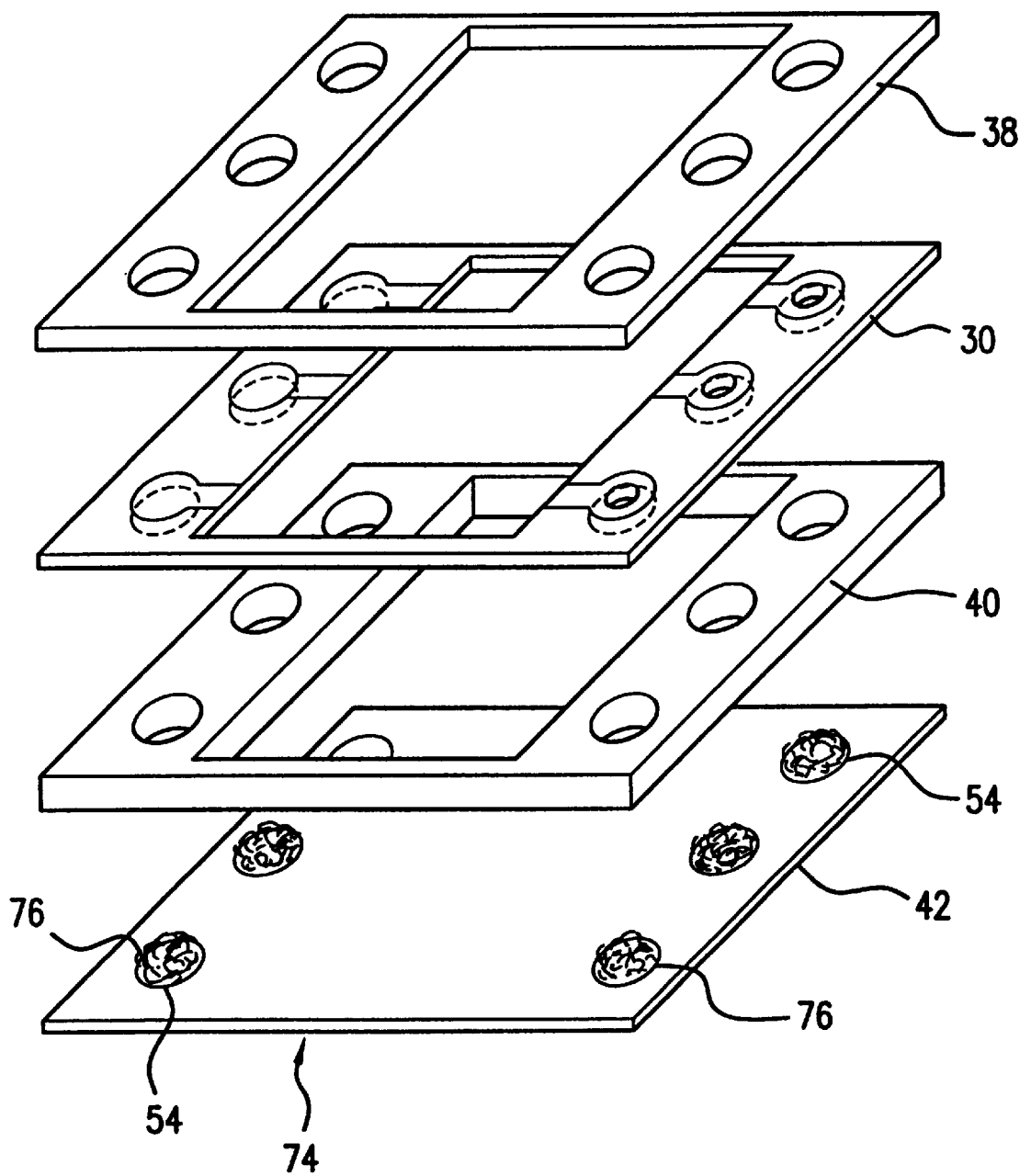
FIG. 12A is an exploded perspective view of a chip carrier in which conductive elements comprised of fuzz buttons or wire masses are mounted in the stacking apertures.
Figure 12B:
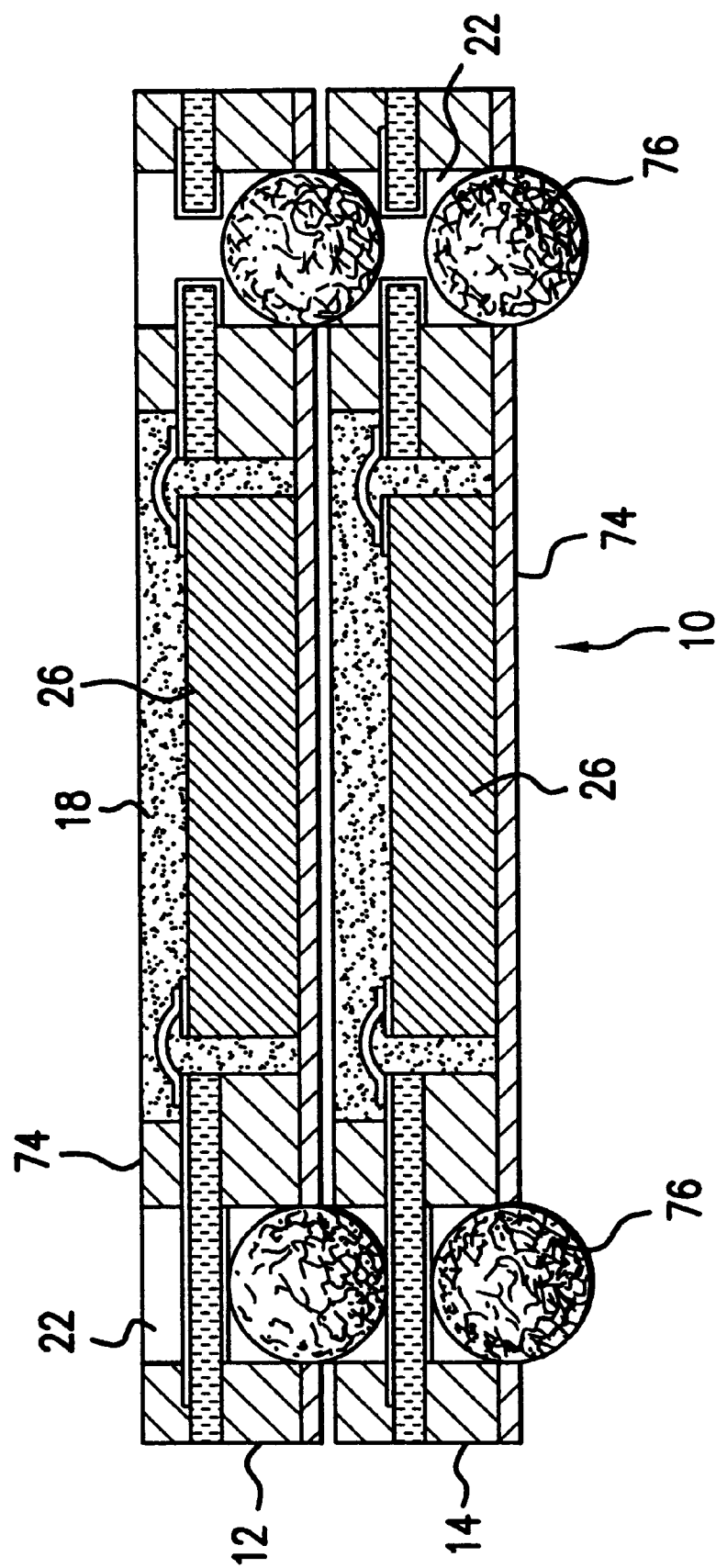
FIG. 12B is a sectional view of a two-high stack of chip packages using the chip carrier shown in FIG. 12A.

Alternatively, fuzz buttons can be used in place of the balls 24. Such an arrangement is shown in FIGS. 12A and 12B. FIG. 12A is an exploded perspective view of a chip carrier 74. The chip carrier 74 is like the chip carrier 16 of FIG. 5, except for the bottom layer 42. In the chip carrier 74 of FIG. 12A, fuzz buttons 76 are mounted within the apertures 54 in the bottom layer 42. The fuzz buttons 76, which are generally spherical balls of conductive wire, are commercially available conductive elements.

With the fuzz buttons 76 imbedded in the apertures 54 in the bottom layer 42, the bottom layer 42 becomes a button board. The bottom layer 42 or button board may be separate from the rest of the chip carrier 74, inasmuch as its only function is to hold the fuzz buttons 76 in place. When assembling a plurality of the chip carrier 74 containing the fuzz buttons 76, a slight pressure must be applied to the stack at all times to maintain electrical contact of the fuzz buttons 76 with the conductive pattern 32 within the apertures 22. The fuzz buttons 76 are used primarily for testing of the chip packages, and are not normally permanently mounted within the apertures 22. They are used to maintain contact with the conductive patterns 32 within the apertures 22 during assembly of a stack of the chip packages for testing purposes. After testing, the stack is disassembled, following which more permanent conductive elements such as the balls 24 are mounted in the apertures 22, where they are secured by solder or conductive epoxy in the manner previously described.

Figure 13:
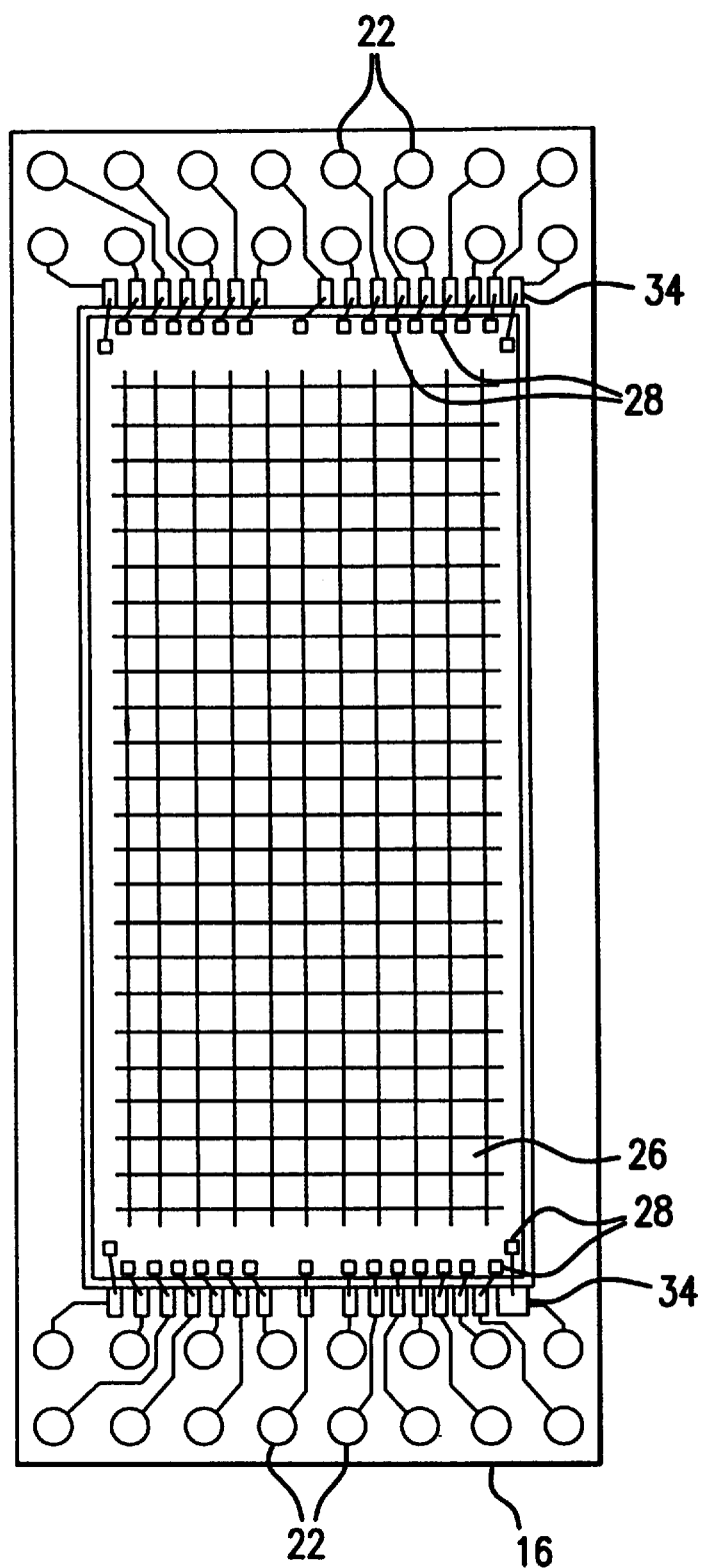
FIG. 13 is a plan view of an elongated chip with contacts at opposite ends thereof wire bonded to adjacent conductive pads of a conductive pattern which extends to stacking apertures located at opposite ends of the chip carrier.

FIG. 13 provides an example of a chip package using a conventional chip with the contacts thereof concentrated at the opposite ends thereof. The chip is 0.241" wide and 0.544" long. The chip is mounted in a chip carrier similar to that shown and previously described in connection with FIG. 7B. The completed chip package measures 0.320" wide by 0.740" long by 0.030" thick. The 0.030" thickness includes the protruding portions of the balls 24 extending from one surface of the chip carrier 16. A stack formed by four such chip packages has a thickness or height of 0.096", which includes the portions of the balls 24 extending from the bottom thereof.

Figure 14A:
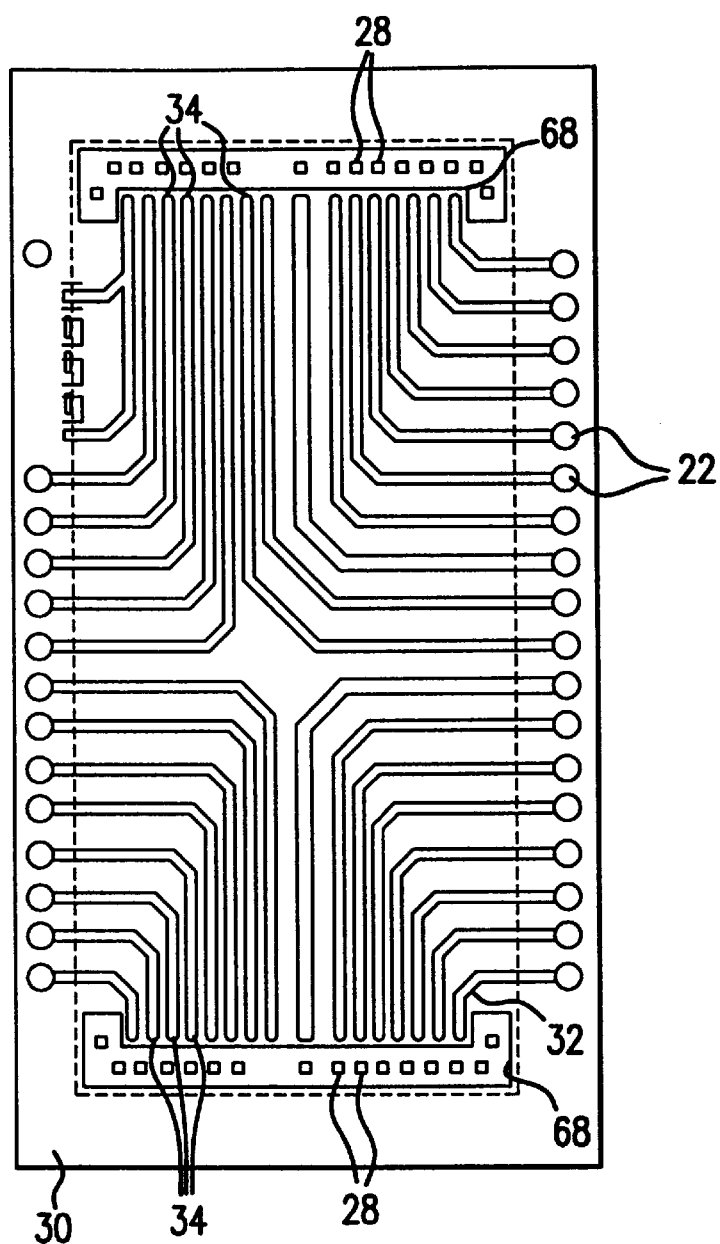
FIGS. 14A and 14B are top and end views of a portion of a chip package in which contacts at the opposite ends of an elongated chip are wire bonded to a conductive pattern which reroutes the connections to stacking apertures arranged along opposite side edges of the chip carrier.
Figure 14B:
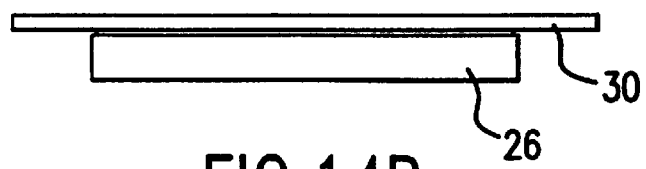

FIGS. 14A and 14B show the same chip used in the arrangement of FIG. 13, but mounted in a chip carrier of the type shown in FIG. 7C. The resulting arrangement requires 14% less mounting area than does the arrangement of FIG. 7C, but is more complex to fabricate because of the extensive conductive pattern 32. The completed chip package measures 0.330" wide by 0.620" long. As in the case of FIG. 13, the thickness of the chip package is approximately 0.030", including the portions of the balls extending from the lower surface thereof.

Figure 15:
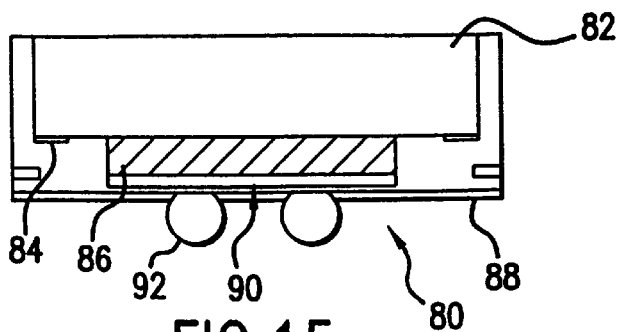
FIG. 15 is a side view of a commercially available ball grid array chip.

FIG. 15 is a sectional view of an Intel 28F640J5 "Strataflash Memory" package 80, which is in a BGA configuration. The memory package 80 includes a die 82 having bond pads 84 and an elastomer 86 at the underside thereof. A solder mask 88 is attached to the elastomer 86 by polyimide tape 90. Solder balls 92 extend downwardly through the solder mask 88, from the elastomer 86. The Intel memory package 80 of FIG. 15 has a width of 302 mils, a length of 643 mils and a height of 36±2 mils which includes the solder balls 92. The solder balls 92 are spaced on a 30 mil pitch.

Figure 16A:
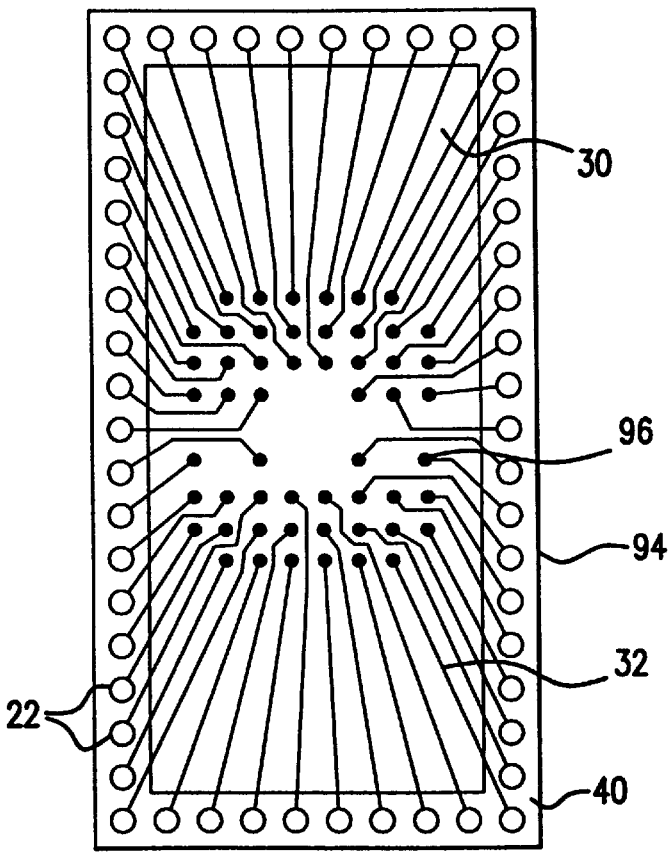
FIGS. 16A and 16B are top and side views of an arrangement in which the ball contacts of the chip of FIG. 15 are soldered to a conductive pattern which reroutes the connections to sting apertures located around the perimeter of the chip carrier.
Figure 16B:
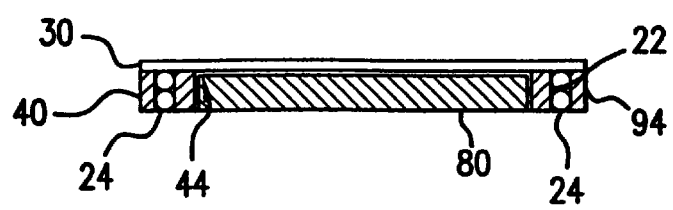

FIGS. 16A and 16B show the memory package 80 mounted within a stackable chip carrier 94. As shown in FIG. 16B, the stackable chip carrier 94 has a continuous base layer 30 mounted on and extending over a center layer 40 having a central opening 44 therein. The memory package 80 as shown in FIG. 15 is inverted and is mounted within the central opening 44 so that the solder balls 92 thereof contact a conductive pattern 32 at the underside of the base layer 30. The conductive pattern 32, which is illustrated in FIG. 16A, includes a pattern of bonding pads 96 at a central portion thereof. The bonding pads 96 are arranged to receive individual ones of the solder balls 92 of the memory package 80, when the memory package 80 is mounted within the central opening 44 in the center layer 40 of the stackable chip carrier 94. The conductive pattern 32 couples the bonding pads 96 to individual ones of the apertures 22 in the center layer 40. Balls 24 are mounted in the apertures 22, in the manner previously described. Because of the substantial thickness of the memory package 80, each of the apertures 22 is provided with a pair of the balls 24, as shown in FIG. 16B.

The memory package 80, the dimensions of which were previously noted, is mounted within the stackable chip carrier 94, to form a chip package measuring 400 mils wide, 760 mils long and 47 mils high or thick, including the portions of the balls 24 which extend from the underside of the chip package. The pitch of the balls 24, mounted within the apertures 22 around the periphery of the center layer 40 of the stackable chip carrier 94, is 40 mils, using balls 24 which are 20 mils in diameter. The conductive pattern 32 is etched copper foil on a 5 mil thick Kapton or equivalent plastic layer.

The chip package of FIG. 16A and 16B illustrates that BGA type dies and packages can be adapted to the stacking format, in accordance with the invention. However, because of the nature of the BGA packages, the thickness of the resulting chip package is considerably greater than in the case of chip packages using bare dies.

Chip packages and stacks according to the invention lend themselves to manufacture using a variety of techniques, many of which are conventional. For example, the three different chip carrier configurations shown in FIGS. 8A, 8B, 9A and 9B can be made in strip form. Auto wire bonders designed to handle lead frames can be adapted to handle such carriers in strip format. Where chips of the CSP or BGA type must be soldered in place, the chip carrier is made in two different sections as previously described in connection with FIGS. 9A and 9B. In that instance, the base layer 30 and the top layer 38 are made in strip form or panel form. Solder paste is stenciled onto the layer, the chips are placed in position, the solder is reflowed, and the remainder of the chip carrier, comprising the center layer 40 and where desired the bottom layer 42, is laminated to the base layer 30.

Figure 17:
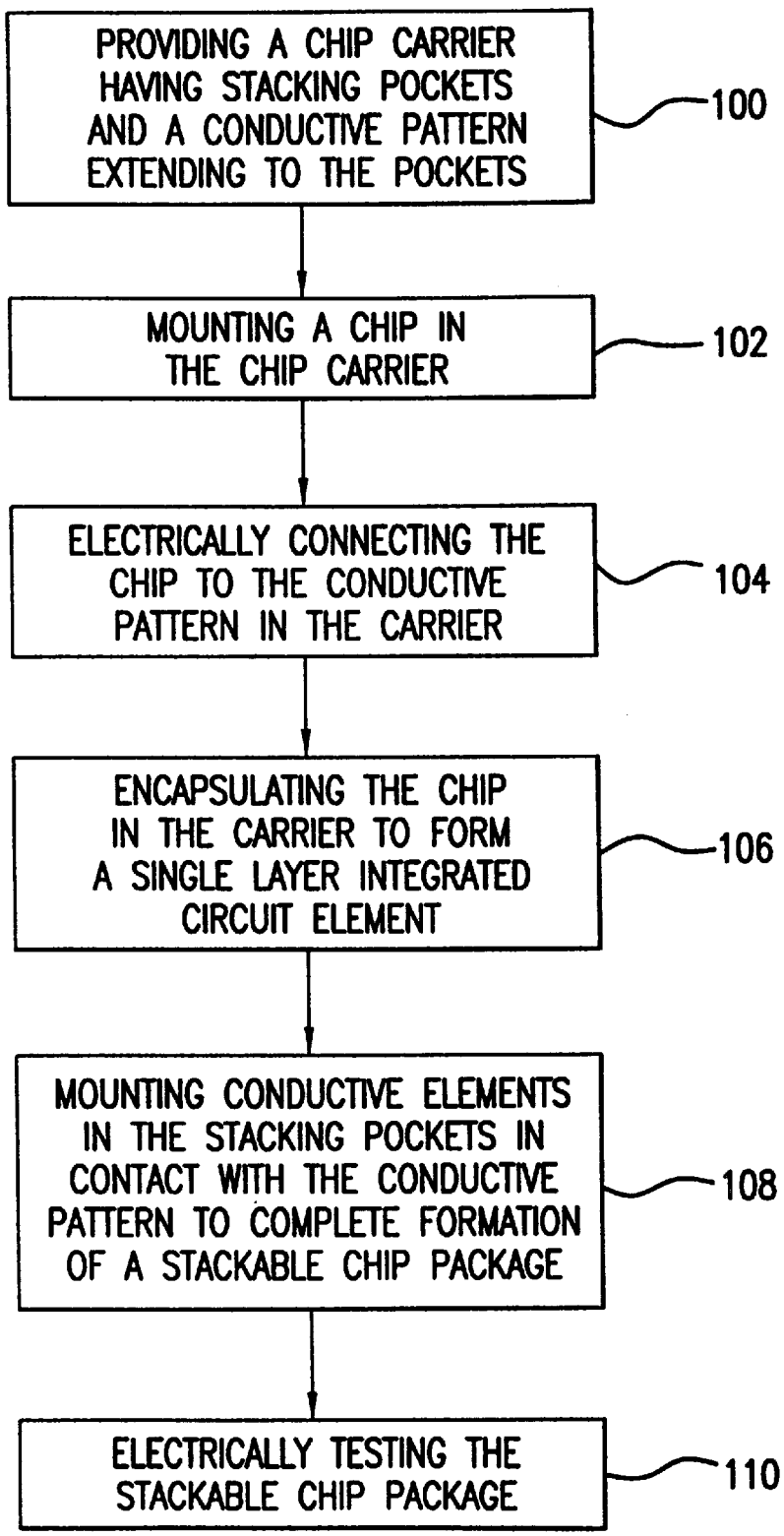
FIG. 17 is a block diagram of the successive steps in a method of making a stackable chip package in accordance with the invention.

By way of summary of the description of the various embodiments above, the successive steps of methods of making stackable chip packages in accordance with the invention are set forth in FIG. 17. In a first step 100, a chip carrier 16 having stacking pockets 22 and a conductive pattern 32 extending to the pockets 22 is provided. In a next step 102, a chip 26 is mounted in the chip carrier 16, such as by mounting within a central opening 20 in the carrier. Next, and in a step 104, the chip 26 is electrically connected to the conductive pattern 32 in the chip carrier 16. As previously described, this is accomplished by wire bonding in the case of bare chips or dyes. In the case of CSP or BGA type chips, electrical interconnection may be accomplished by disposing solder paste on the conductive pattern 32 and then reflowing the solder to solder the balls of the chips thereto. The chip 26 is then encapsulated within the chip carrier 16, in a step 106, using the potting compound 18. This forms a single layer integrated circuit element in accordance with the invention.

In a following step 108, the balls 24 or other conductive elements are mounted in the stacking pockets 22 so as to contact the conductive pattern 32. The balls 22 may be secured therein using conductive epoxy or solder. This completes the formation of the stackable chip package. The completed chip package may then be electrically tested in a following step 110.

Figure 18:
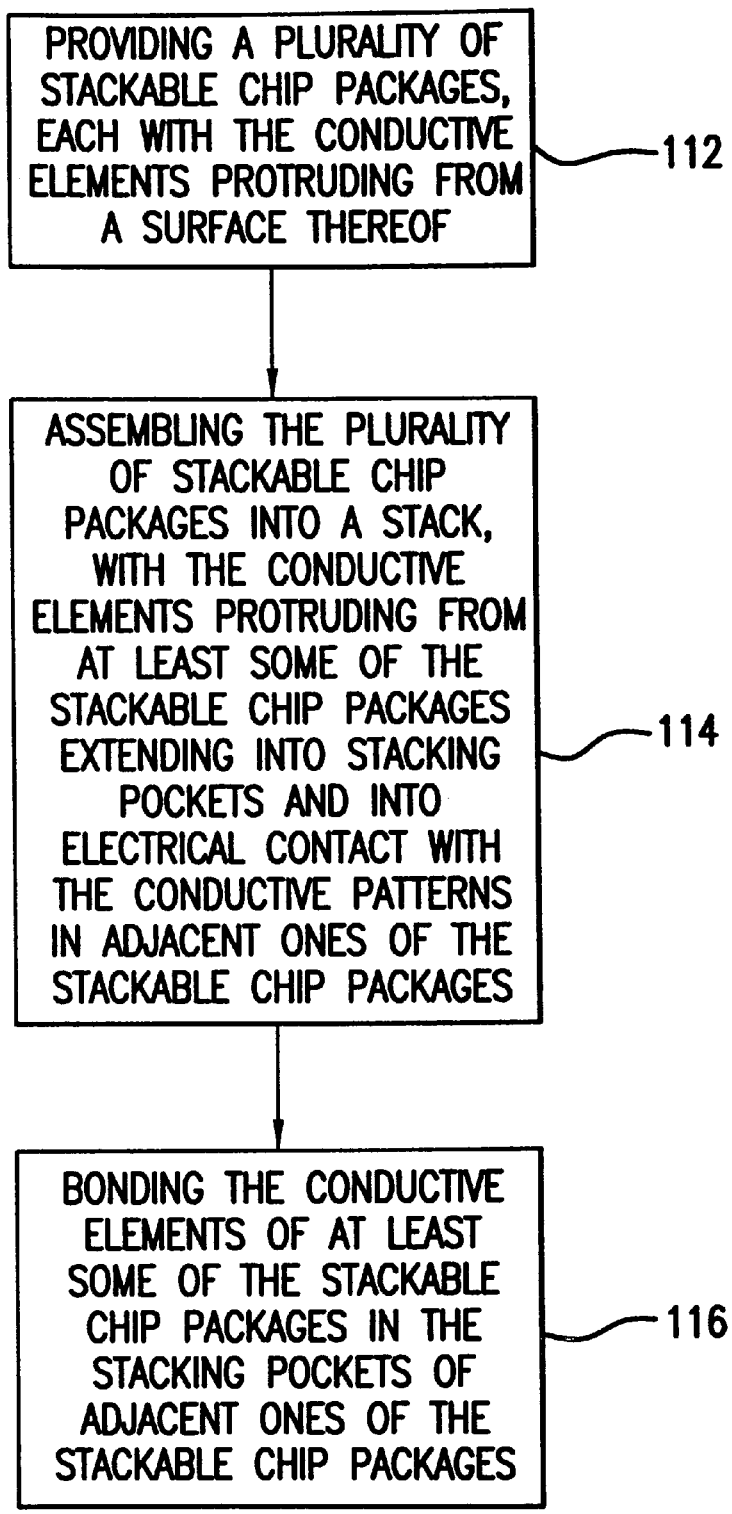
FIG. 18 is a block diagram of the successive steps in a method of assembling a plurality of chip packages made by the method of FIG. 17 into a chip stack.

FIG. 18 illustrates the successive steps of a method of assembling the chip packages into a stack, in accordance with the invention. In a first step 112, a plurality of the chip packages is provided. Each chip package has conductive elements such as the balls 24 protruding from a surface thereof. In a next step 114, a plurality of the stackable chip packages are assembled into a stack, such that the balls 24 or other conductive elements protruding from at least some of the chip packages extend into the stacking pockets 22 and into electrical contact with the conductive patterns 32 in adjacent ones of the chip packages. In a further step 116, the balls 24 or other conductive elements of at least some of the chip packages are bonded within the stacking pockets 22 of adjacent ones of the chip packages, such as by using solder or conductive epoxy. This completes the assembly of the chip package.

It will be appreciated by those skilled in the art that various advantages are provided by the chip stacks and method of making the same in accordance with the invention. One advantage is that chips or dies of standard configuration can be used. Dies with special bump configurations are not required, as is true of some prior art techniques. Standard wedge bonding techniques can be used to electrically connect bare chips or dies within the chip carriers. Standard chip-on-board encapsulation materials can be used to encapsulate the chip mounted within the chip carrier. Metals spheres are suitable for stacking the formed chip packages and are readily available. The stacking pockets are ideally used with conductive epoxy or solder, as opposed to surface pads which make the use of the conductive epoxy or solder more difficult. The stacked arrays contain chip packages having a thickness of approximately 15–20 mils per chip package, which is approximately half that of the chip packages within conventional stacks. Each chip package can be electrically tested before being committed to a stack.

While the invention has been shown and described with reference to a preferred embodiment thereof, it will be understood by those skilled in the art that various changes in form and details may be made therein without departing from the spirit and scope of the invention.

What is claimed is:

1. A stackable chip carrier comprising the combination of:

a base layer having opposed upper and lower surfaces and a conductive pattern disposed on at least one of the upper and lower surfaces thereof;

a top layer mounted to the upper surface of the base layer and having a top layer central opening and at least one top layer aperture disposed therein;

a center layer mounted to the lower surface of the base layer and having a center layer central opening and at least one center layer aperture disposed therein, the center layer aperture being generally aligned with the top layer aperture;

at least one stacking aperture disposed within the carrier, the stacking aperture having an upper portion defined by the top layer aperture and a lower portion defined by the center layer aperture; and at least one conductive element disposed within the lower portion of the stacking aperture and electrically connected to the conductive pattern;

the conductive element being secured within the lower portion of the stacking aperture via a quantity of conductive epoxy and sized to protrude from an exposed surface of the center layer.

2. The chip carrier of claim 1 wherein the top and center layers and a portion of the base layer other than for the conductive pattern are fabricated from a plastic material.

3. The chip carrier of claim 1 wherein the base layer has a base layer central opening therein which is generally coincident with the center layer central opening.

4. The chip carrier of claim 3 wherein:

the conductive pattern defines a multiplicity of bonding pads which are disposed on the upper surface of the base layer at opposite sides of the base layer central opening; and the top layer central opening is larger than the base layer central opening so as to expose the bonding pads.

5. The chip carrier of claim 3 further in combination with an integrated circuit chip mounted in the center and base layer central openings and electrically connected to the conductive pattern, the chip carrier and the chip collectively defining a stackable integrated circuit chip package.

6. The chip package of claim 5 wherein the chip is encapsulated within the center and base layer central openings by a sealing compound.

7. The chip carrier of claim 5 wherein:

the conductive pattern defines a multiplicity of bonding pads which are disposed on the upper surface of the base layer at opposite sides of the base layer central opening; and the chip has a plurality of contacts thereon which are wire bonded to respective ones of the bonding pads.

8. The chip carrier of claim 1 further comprising a bottom layer mounted to the center layer opposite the base layer and having at least one bottom layer aperture disposed therein and generally aligned with the center layer aperture, the lower portion of the stacking aperture being collectively defined by the center layer and bottom layer apertures.

9. The chip carrier of claim 8 wherein the top, center and bottom layers, and a portion of the base layer other than for the conductive pattern are fabricated from a plastic material.

10. The chip carrier of claim 1 wherein the conductive pattern is formed from etched layers of copper cladding disposed on each of the upper and lower surfaces of the base layer.

11. The chip carrier of claim 10 wherein:

the base layer has at least one base layer aperture disposed therein and generally aligned with the top and center layer apertures; and the base layer aperture is plated through between the layers of copper cladding.

12. The chip carrier of claim 10 wherein the layers of copper cladding on the upper and lower surfaces of the base layer substantially segregate the upper portion of the stacking aperture from the lower portion thereof.

13. The chip carrier of claim 10 wherein the base layer includes at least one base layer aperture which is disposed therein adjacent the top layer and center layer apertures and is plated through between the layers of copper cladding.

14. The chip carrier of claim 10 wherein:

the base layer has at least one base layer aperture disposed therein and generally aligned with the top and center layer apertures; and at least one of the layers of copper cladding substantially covers the base layer aperture.

15. The chip carrier of claim 10 wherein:

the top and center layers have a plurality of top and center layer apertures disposed therein which define respective ones of the upper and lower portions of a plurality of stacking apertures;

the base layer has a plurality of base layer apertures therein which are generally aligned with respective ones of the top and center layer apertures;

a portion of one of the layers of copper cladding extends between one of an adjacent pair of the upper and lower portions of the stacking apertures; and the base and center layers have aligned tooling apertures disposed therein adjacent the portion of the layer of copper cladding.

16. The chip carrier of claim 1 wherein the conductive element comprises a metallic ball.

17. The chip carrier of claim 16 wherein two metallic balls are disposed within the lower portion of the stacking aperture and secured therewithin via the conductive epoxy, one of the metallic balls protruding from the exposed surface of the center layer.

18. The chip carrier of claim 1 further in combination with an integrated circuit chip mounted within the center layer central opening and electrically connected to the conductive pattern, the chip carrier and the chip collectively defining a stackable integrated circuit chip package.

19. The chip package of claim 18 wherein the chip has a plurality of ball contacts protruding from a surface thereof which are electrically connected to the conductive pattern.

20. The chip package of claim 19 wherein the plurality of ball contacts comprise a ball grid array of contacts on the surface of the chip.

* * * * *